(12) United States Patent
Yamakita

(10) Patent No.: US 11,672,125 B2
(45) Date of Patent: Jun. 6, 2023

(54) SEMICONDUCTOR MEMORY DEVICE INCLUDING A MEMORY CELL ARRAY

(71) Applicant: Xioxia Corporation, Tokyo (JP)

(72) Inventor: Shigehiro Yamakita, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 313 days.

(21) Appl. No.: 17/007,659

(22) Filed: Aug. 31, 2020

(65) Prior Publication Data

US 2021/0126004 A1 Apr. 29, 2021

(30) Foreign Application Priority Data

Oct. 23, 2019 (JP) .............................. JP2019-192722

(51) Int. Cl.
- *H10B 43/50* (2023.01)
- *H10B 43/10* (2023.01)
- *H10B 43/40* (2023.01)
- *G11C 16/04* (2006.01)
- *H10B 43/27* (2023.01)

(52) U.S. Cl.
CPC .............. *H10B 43/50* (2023.02); *H10B 43/10* (2023.02); *H10B 43/40* (2023.02); *G11C 16/0483* (2013.01); *H10B 43/27* (2023.02)

(58) Field of Classification Search
CPC ......... H01L 27/11575; H01L 27/11548; H01L 27/11573; H01L 27/11526; H01L 27/11582; H01L 27/11556
USPC ....................................................... 257/390
See application file for complete search history.

(56) References Cited

U.S. PATENT DOCUMENTS

| | | | |
|---|---|---|---|
| 7,563,664 B2 * | 7/2009 | Ichige | H01L 21/82385 438/257 |
| 9,558,945 B2 | 1/2017 | Fukuzumi et al. | |
| 2016/0181268 A1 * | 6/2016 | Chuang | H01L 27/11573 438/587 |
| 2017/0059908 A1 * | 3/2017 | Yen | H01L 27/124 |
| 2017/0330887 A1 * | 11/2017 | Kim | H01L 27/1157 |
| 2018/0151579 A1 * | 5/2018 | Liu | H01L 27/11534 |
| 2019/0057973 A1 * | 2/2019 | Terada | H01L 27/11575 |
| 2019/0148389 A1 * | 5/2019 | Lin | H01L 27/11534 257/508 |
| 2019/0378857 A1 * | 12/2019 | Lee | H01L 27/11521 |

FOREIGN PATENT DOCUMENTS

JP 2016-062901 A 4/2016

* cited by examiner

*Primary Examiner* — Khiem D Nguyen
(74) *Attorney, Agent, or Firm* — Foley & Lardner LLP

(57) ABSTRACT

A semiconductor memory device includes a substrate including a first region, as second region, a third region and a fourth regions, the first region including a memory cell array, the second region including a circuit for controlling the memory cell array, the third region separating the first region and the second region, and the fourth region surrounding the third region, a first transistor provided in the second region, a second transistor provided in the third region between the first region and the first transistor, a third transistor provided in the third region between the first transistor and the second transistor, and a first insulating layer including a first portion disposed above the first to third transistors, and a second portion disposed in contact with the substrate between the second transistor and the third transistor.

14 Claims, 23 Drawing Sheets

SEMICONDUCTOR MEMORY DEVICE INCLUDING A MEMORY CELL ARRAY

CROSS-REFERENCE TO RELATED APPLICATION(S)

This application is based upon and claims the benefit of priority from Japanese Patent Application No. 2019-192722, filed Oct. 23, 2019, the entire contents of which are incorporated herein by reference.

FIELD

Embodiments described herein relate generally to a semiconductor memory device.

BACKGROUND

A NAND flash memory is known as a semiconductor memory device.

DETAILED DESCRIPTION

Figure 1:
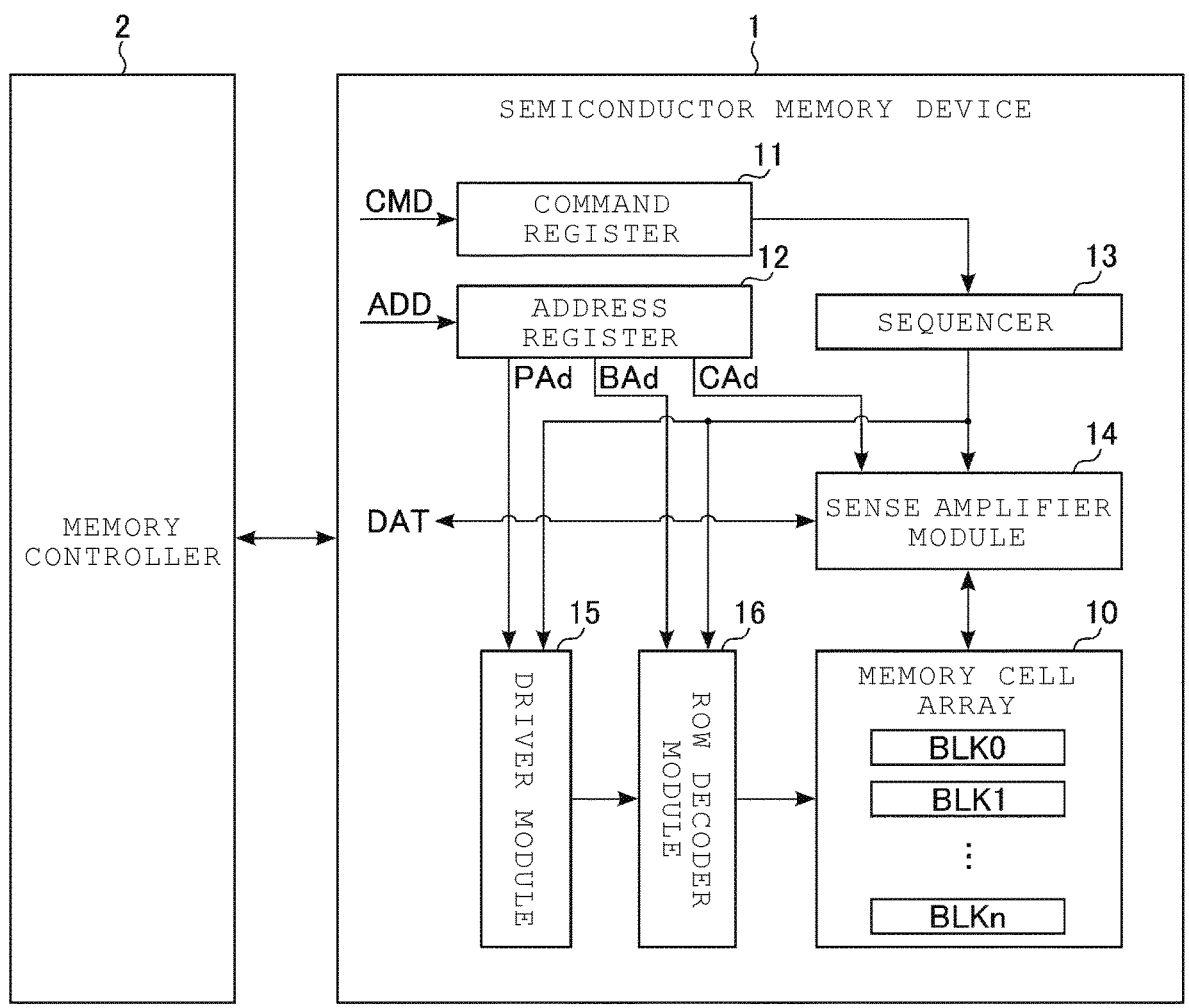
FIG. 1 is a block diagram of a semiconductor memory device according to a first embodiment.

At least one embodiment provides a semiconductor memory device capable of improving yield.

In general, according to at least one embodiment, a semiconductor memory device includes a substrate including a first region, a second region, a third region, and a fourth region, the first region including a memory cell array, the second region including a circuit for controlling the memory cell array, the third region separating the first region and the second region, and the fourth region surrounding the third region, a first transistor disposed in the second region, a second transistor disposed in the third region between the first region and the first transistor, the second transistor having a gate in an electrically unconnected state, a third transistor disposed in the third region between the first transistor and the second transistor, the third transistor having a gate in an electrically unconnected state, and a first insulating layer including a first portion provided above the first to third transistors and a second portion in contact with the substrate between the second transistor and the third transistor.

Hereinafter, embodiments will be described below with reference to the drawings. The embodiments illustrate a device and method for embodying the technical idea of the present disclosure. The drawings are schematic or conceptual, and the dimensions and ratios in the drawings are not necessarily the same as the actual ones. The technical idea of the present disclosure is not specified by the shape, structure, arrangement, or the like of the elements.

In the description below, elements having substantially the same functions and configurations are denoted by the same reference numerals. The numbers behind the letters that constitute the reference numerals are used to distinguish between elements that are referred to by reference numerals including the same letters and that have similar configurations. When it is not necessary to distinguish elements indicated by reference numerals containing the same letter from each other, these elements are each referred to by a reference numeral containing only letters.

1. First Embodiment

A semiconductor memory device according to a first embodiment will be described. Hereinafter, as the semiconductor memory device, a three-dimensionally stacked NAND flash memory in which memory cell transistors are three-dimensionally stacked on a semiconductor substrate will be described as an example.

1.1 Configuration

1.1.1 Overall Configuration of Semiconductor Memory Device

First, an example of the overall configuration of the semiconductor memory device will be described with reference to FIG. 1. FIG. 1 shows a configuration example of a semiconductor memory device 1. The semiconductor memory device 1 may be a NAND flash memory capable of storing data in a nonvolatile manner and can be controlled by an external memory controller 2.

As shown in FIG. 1, the semiconductor memory device 1 includes, for example, a memory cell array 10, a command register 11, an address register 12, a sequencer 13, a sense amplifier module 14, a driver module 15, and a row decoder module 16.

The memory cell array 10 includes a plurality of blocks BLK0 to BLKn (n is an integer of 1 or more). The block BLK is a set of a plurality of memory cell transistors capable of storing data in a nonvolatile manner and is used as, for example, a data erasing unit. Further, the memory cell array 10 is provided with a plurality of bit lines and a plurality of word lines. Each memory cell transistor is associated with, for example, one bit line and one word line. The detailed configuration of the memory cell array 10 will be described later.

The command register 11 holds the command CMD received by the semiconductor memory device 1 from the memory controller 2. The command CMD includes, for example, a command that causes the sequencer 13 to execute a read operation, a write operation, an erase operation, and the like.

The address register 12 stores the address information ADD received by the semiconductor memory device 1 from the memory controller 2. The address information ADD includes, for example, a block address BAd, a page address PAd, and a column address CAd. For example, the block address BAd, the page address PAd, and the column address CAd are used to select the block BLK, the word line, and the bit line, respectively.

The sequencer 13 controls the overall operation of the semiconductor memory device 1. For example, the sequencer 13 controls the sense amplifier module 14, the driver module 15, the row decoder module 16 and the like based on the command CMD stored in the command register 11 to execute a read operation, a write operation, an erase operation, or the like.

The sense amplifier module 14 applies a required voltage to each bit line in accordance with the write data DAT received from the memory controller 2 in the write operation. Further, in the read operation, the sense amplifier module 14 determines the data stored in the memory cell transistor based on the voltage of the bit line and transfers the determination result to the memory controller 2 as the read data DAT.

The driver module 15 generates a voltage to be used in the read operation, the write operation, the erase operation, and the like. Then, the driver module 15 applies the generated voltage to the signal line corresponding to the selected word line, for example, based on the page address PAd stored in the address register 12.

The row decoder module 16 selects one block BLK in the corresponding memory cell array 10 based on the block address BAd stored in the address register 12. Then, the row decoder module 16 transfers, for example, the voltage applied to the signal line corresponding to the selected word line, to the selected word line in the selected block BLK.

The semiconductor memory device 1 and the memory controller 2 described above may be combined into one semiconductor device. Examples of such a semiconductor device include a memory card such as an SD™ card and a solid state drive (SSD).

1.1.2 Planar Layout of Semiconductor Memory Device

Figure 2:
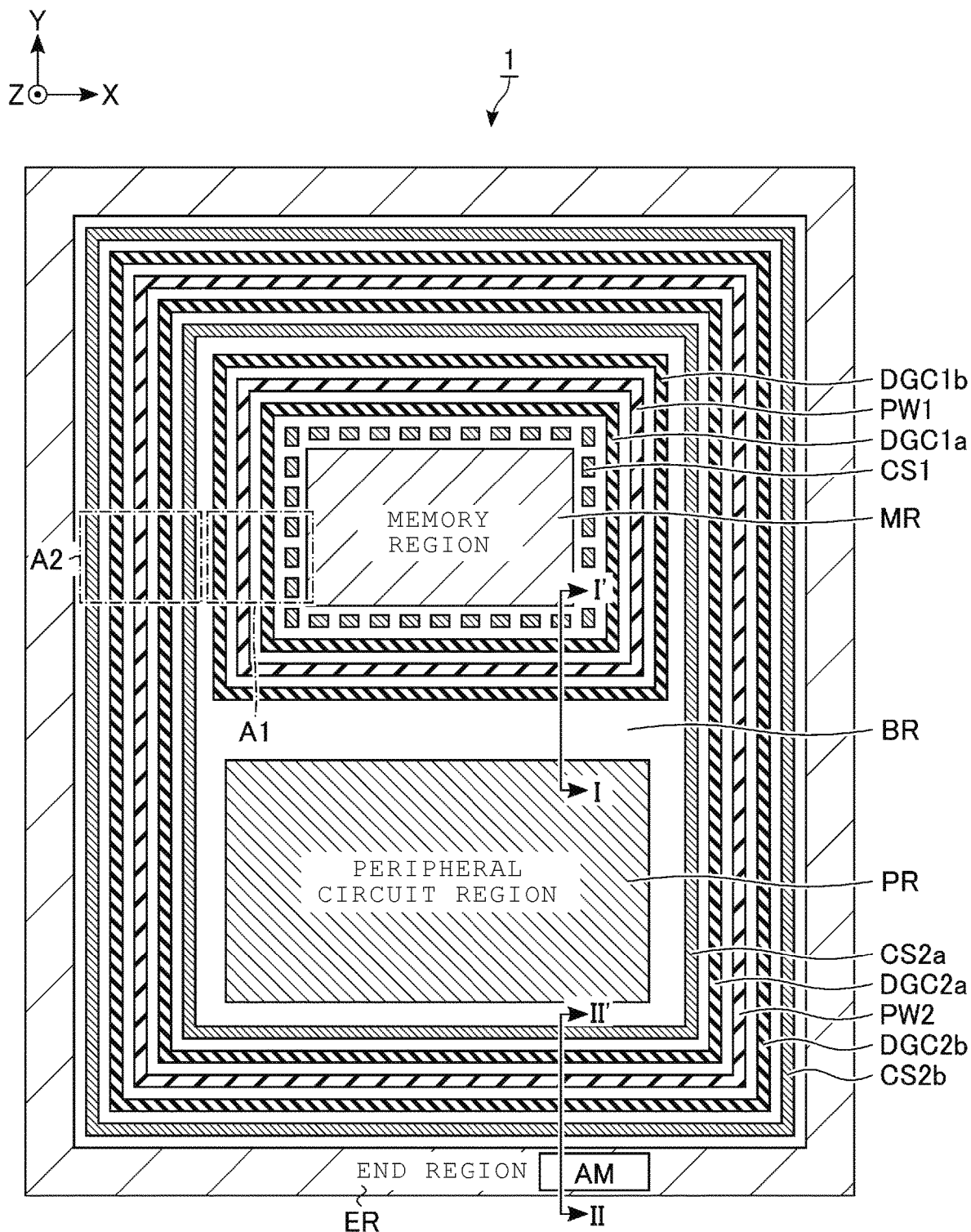
FIG. 2 is a diagram showing an example of a planar layout of the semiconductor memory device according to the first embodiment.
Figure 3:
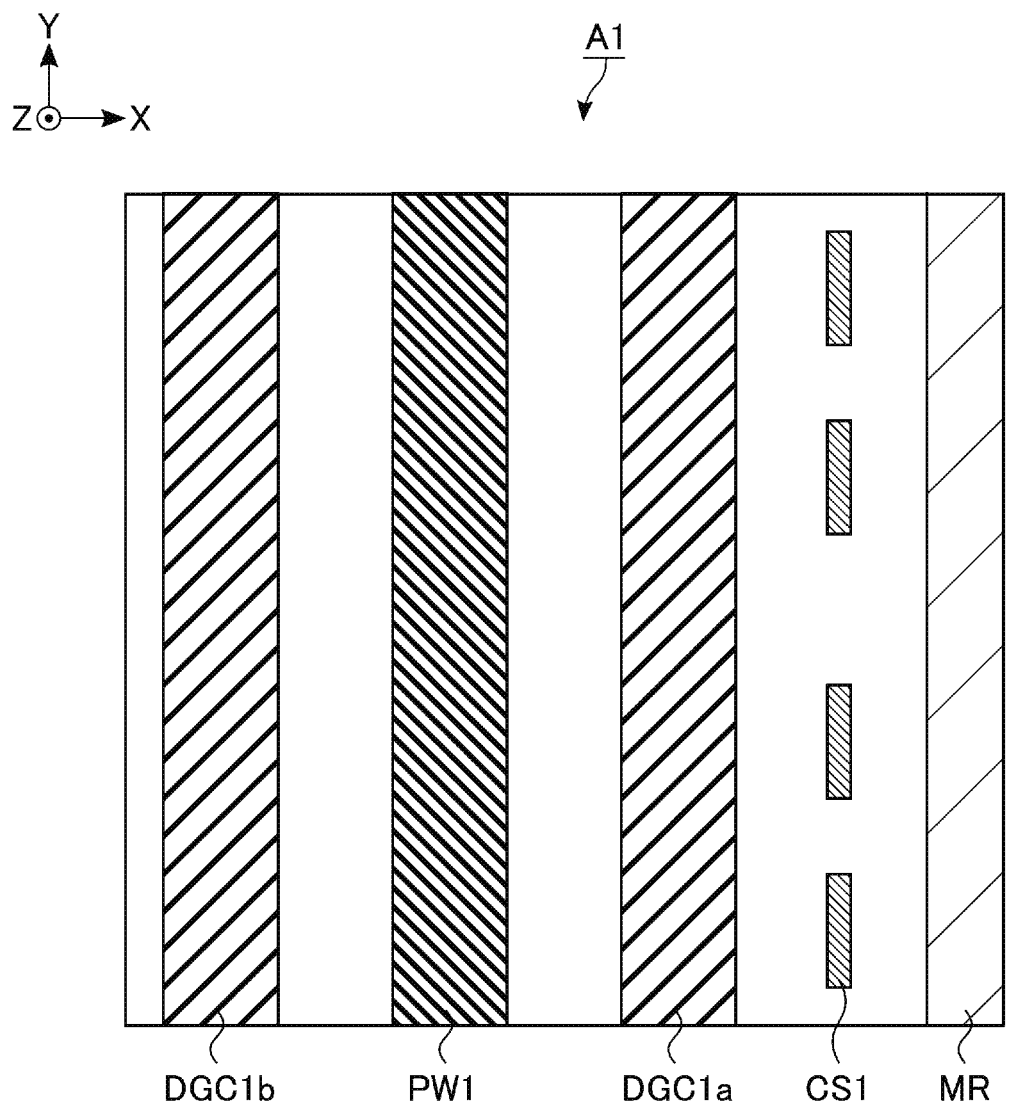
FIG. 3 is an enlarged view of a region A1 of FIG. 2.
Figure 4:
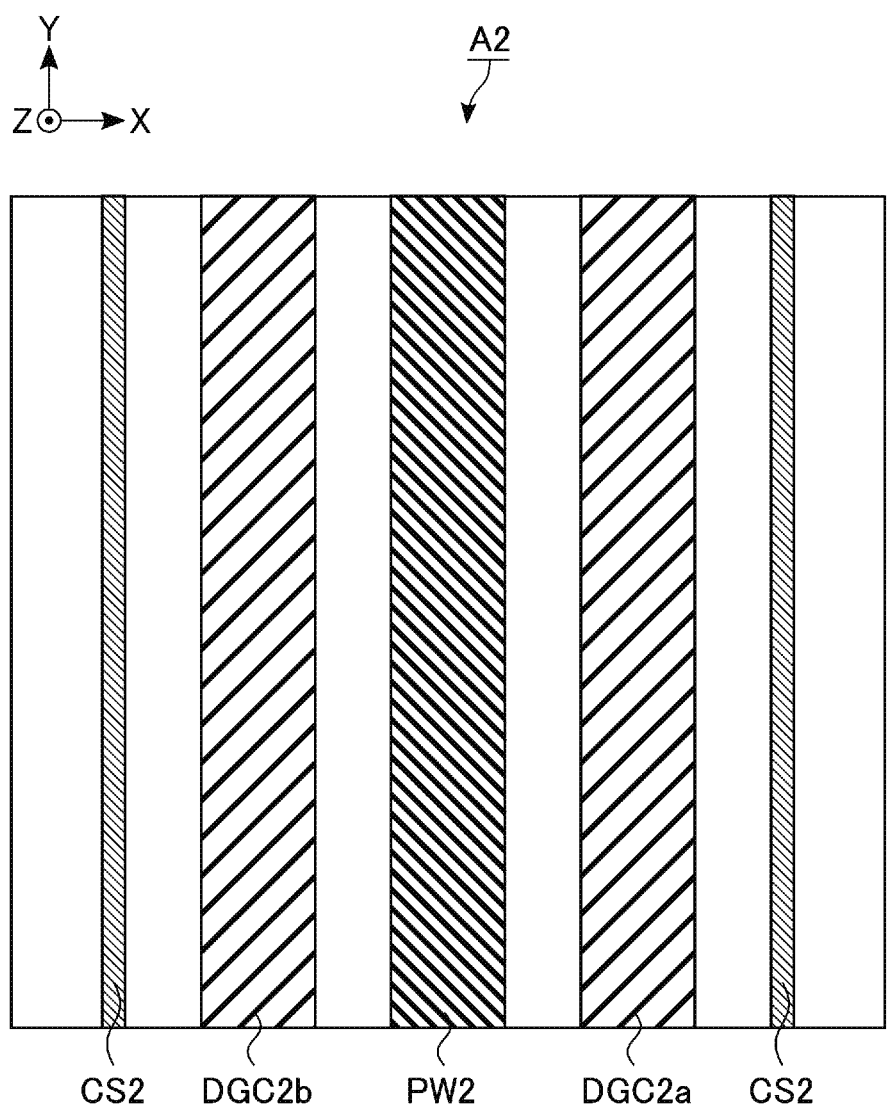
FIG. 4 is an enlarged view of a region A2 of FIG. 2.

Next, the planar layout of the semiconductor memory device 1 will be described with reference to FIGS. 2 to 4. FIG. 2 illustrates an example of a planar layout of the semiconductor memory device 1. FIG. 3 illustrates a region A1 of FIG. 2. FIG. 4 illustrates a region A2 of FIG. 2.

In the drawings referred to below, the X direction corresponds to the extending direction of the word lines WL, the Y direction corresponds to the extending direction of the bit lines BL, and the Z direction corresponds to the vertical direction with respect to the surface of the semiconductor substrate 100 used to form the semiconductor memory device 1. Hatching is appropriately added to the plan view in order to make enhance visibility. The hatching added to the plan view is not necessarily related to the material and characteristics of the hatched element. Further, in order to simplify the description, a part of the wiring layer and the insulating layer are omitted.

As shown in FIG. 2, the planar layout of the semiconductor memory device 1 is divided into, for example, a memory region MR, a peripheral circuit region PR, an end region ER, and a boundary region BR.

The memory region MR may be, for example, a rectangular region provided in the inner region of the semiconductor substrate 100 and includes the memory cell array 10. The memory region MR may be arranged in any shape and any region. When the semiconductor memory device 1 includes a plurality of memory cell arrays 10, a plurality of memory regions MR may be provided on the semiconductor substrate 100, and a plurality of memory cell arrays 10 may be provided in one memory region MR.

The peripheral circuit region PR is, for example, a rectangular region provided inside the semiconductor substrate 100 and includes the sequencer 13 and the like. The peripheral circuit region PR may be arranged in any shape and any region and is arranged adjacent to the memory region MR in the Y direction, for example. A plurality of peripheral circuit regions PR may be provided on the semiconductor substrate 100.

The end region ER is, for example, a square annular-shaped region including the end of the chip and surrounding the outer circumference of the memory region MR and the peripheral circuit region PR. The end region ER includes, for example, a structure similar to the stacked structure of the memory cell array 10 described below, and may include one or a plurality of alignment marks AM and the like. The structure in the end region ER may be removed by a dicing process at the time of manufacturing the semiconductor memory device 1. Further, the alignment mark AM may be provided in the boundary region BR.

The boundary region BR is a region that is surrounded by the end region ER and does not overlap the memory region MR and the peripheral circuit region PR. In other words, the boundary region BR has a portion surrounding the periphery of the memory region MR and a portion surrounding the periphery of the peripheral circuit region PR. The boundary region BR includes a structure that prevents an adverse effect that may occur on the elements in the peripheral circuit region PR from the memory region MR and the end region ER in the manufacturing process of the semiconductor memory device 1.

In the boundary region BR, for example, two blocking portions PW (PW1 and PW2), dummy gates DGC (DGC1*a*, DGC1b, DGC2a, and DGC2b) in four dummy transistors, a plurality of contact plugs CS1, and contact plugs CS2a and CS2b are provided.

The blocking portion PW1 may surround the periphery of the memory region MR. The blocking portion PW2 surrounds the periphery of the memory region MR and the peripheral circuit region PR. That is, the blocking portion PW1 is surrounded by the blocking portion PW2. The blocking portions PW1 and PW2 have a structure for protecting the transistor TR in the peripheral circuit region PR in the manufacturing process of the semiconductor memory device 1. The planar shapes of the blocking portions PW1 and PW2 are not limited to the square annular shape and may be designed in any shape.

The contact plug CS1 is provided in the boundary region BR, for example, between the memory region MR and the blocking portion PW1, and the bottom surface thereof contacts the semiconductor substrate. For example, the contact plug CS1 electrically connects a well region formed near the surface of the semiconductor substrate and a wiring layer provided above the semiconductor substrate.

As shown in FIG. 3, the dummy gate DGC1a is provided between the contact plug CS1 and the blocking portion PW1 and surrounds the periphery of the contact plug CS1. The dummy gate DGC1b is provided between the blocking portion PW1 and the end region ER and surrounds the periphery of the blocking portion PW1. In other words, the dummy gates DGC1a and DGC1b are respectively provided along the inner circumference and the outer circumference of the blocking portion PW1. The dummy gates DGC1a and DGC1b have a transistor gate structure. The dummy gates DGC1a and DGC1b function as etch stoppers for preventing the expansion of the etching region on the XY plane when the interlayer insulating film is wet-etched in the manufacturing process of the blocking portion PW1. The planar shape of the dummy gates DGC1a and DGC1b is not limited to the square annular shape, and may be designed in any shape.

As shown in FIG. 2, the contact plugs CS2a and CS2b are respectively provided along the inner circumference and the outer circumference of the blocking portion PW2, and the bottom surface thereof contacts the semiconductor substrate. The contact plugs CS2a and CS2b have a function as a guard ring. More specifically, the contact plugs CS2a and CS2b prevent cracks or peeling from reaching the memory region MR and the peripheral circuit region PR when cracking or peeling of an interlayer insulating film or the like occurs in the end region ER of the semiconductor memory device 1 in the dicing process, for example. Further, the contact plugs CS2a and CS2b prevent the permeation of water or the like from the end region ER of the semiconductor memory device 1 into the memory region MR and the peripheral circuit region PR. The planar shape of the contact plugs CS2a and CS2b is not limited to the square annular shape, and may be designed in any shape.

As shown in FIG. 4, the dummy gate DGC2a is provided between the contact plug CS2a and the blocking portion PW2 and surrounds the periphery of the contact plug CS2a. The dummy gate DGC2b is provided between the blocking portion PW2 and the contact plug CS2b and surrounds the periphery of the blocking portion PW2. In other words, the dummy gates DGC2a and DGC2b are provided along the inner circumference and the outer circumference of the blocking portion PW2, respectively. Similar to the dummy gates DGC1a and DGC1b, the dummy gates DGC2a and DGC2b have a transistor gate structure. The dummy gates DGC2a and DGC2b function as etch stoppers for preventing the expansion of the etching region on the XY plane when the interlayer insulating film is wet-etched in the manufacturing process of the blocking portion PW2. The planar shape of the dummy gates DGC2a and DGC2b is not limited to the square annular shape and may be designed in any shape.

1.1.3 Cross-Sectional Configuration of Semiconductor Memory Device

Figure 5:
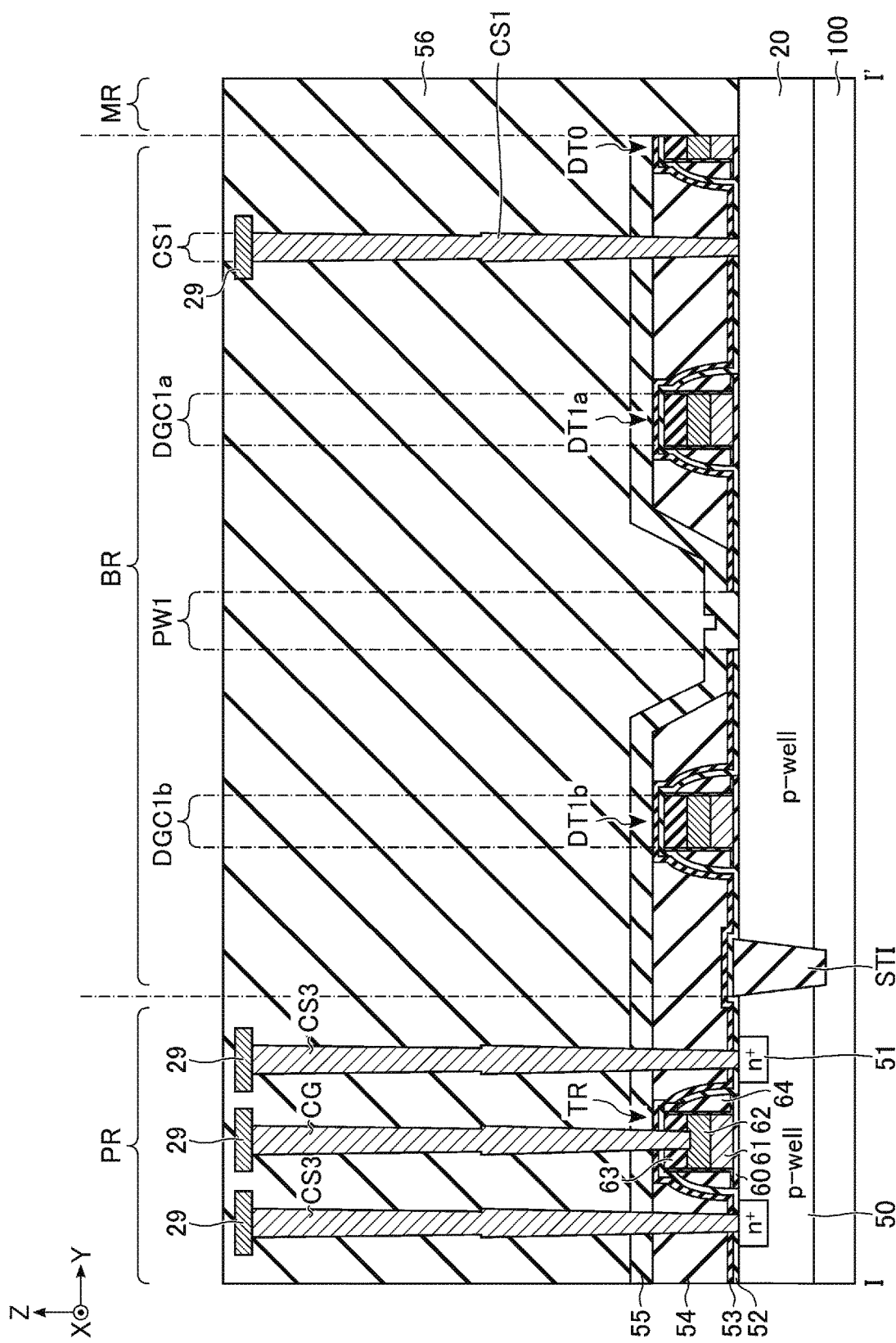
FIG. 5 is a cross-sectional view taken along line I-I' of FIG. 2.
Figure 6:
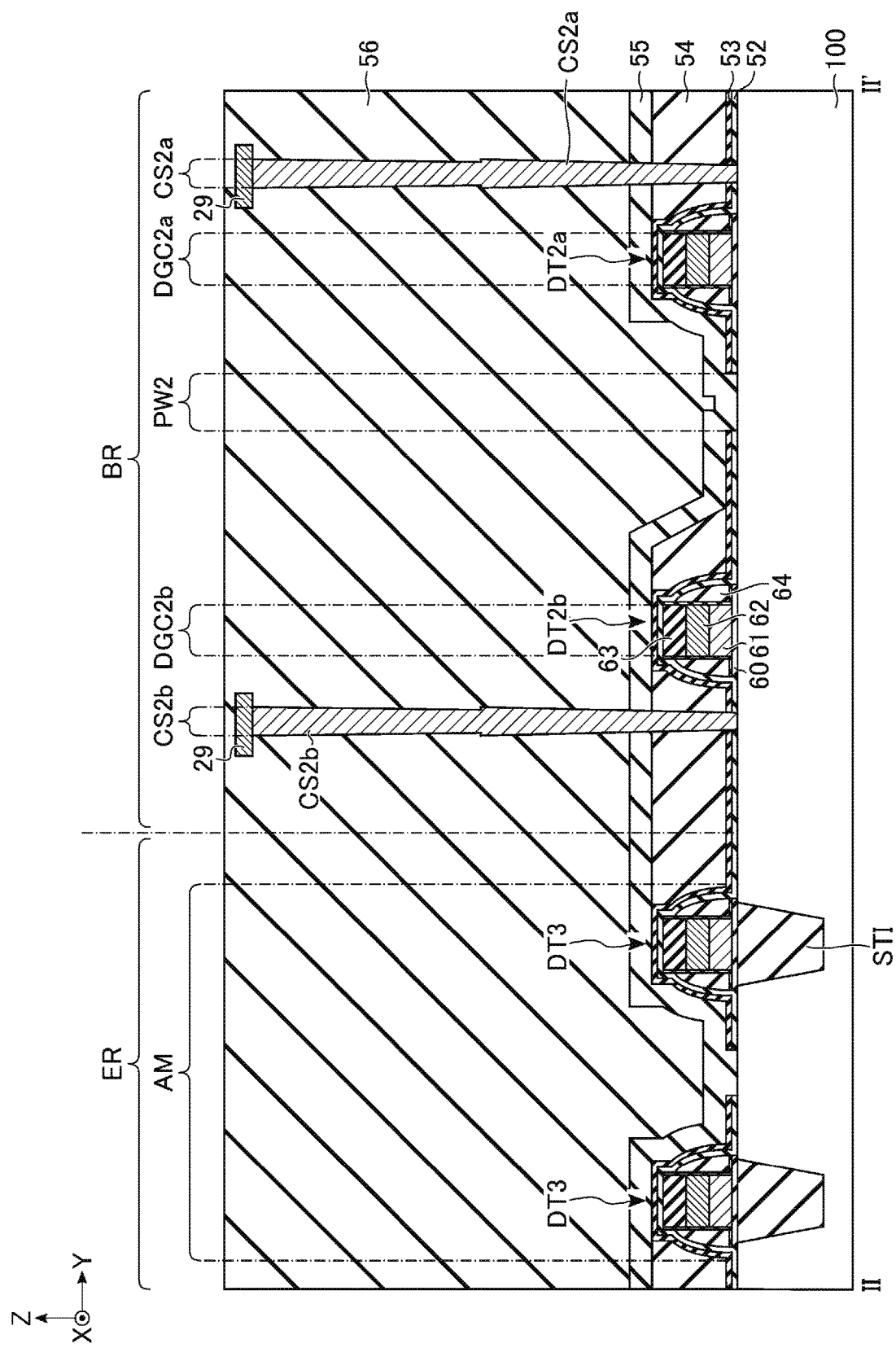
FIG. 6 is a cross-sectional view taken along line II-II' of FIG. 2.

Next, the cross-sectional configuration of the semiconductor memory device will be described with reference to FIGS. 5 and 6. FIG. 5 is a cross-sectional view taken along line I-I' of FIG. 2 and shows a part of the boundary region BR between the memory region MR and the peripheral circuit region PR, and the peripheral circuit region PR. FIG. 6 is a cross-sectional view taken along line II-II' of FIG. 2 and illustrates the boundary region BR between the peripheral circuit region PR and the end region ER, and the end region ER.

First, the boundary region BR between the memory region MR and the peripheral circuit region PR, and the peripheral circuit region PR will be described.

As shown in FIG. 5, in the boundary region BR between the memory region MR and the peripheral circuit region PR, and the peripheral circuit region PR, p-type well regions 20 and 50, an $n^+$ type diffusion layer region 51, an element isolation region STI, insulating layers 52 to 56, the transistor TR, dummy transistors DT0, DT1a and DT1b, contact plugs CG and CS3, and a conductor layer 29 are provided.

The p-type well region 20 in the boundary region BR and the p-type well region 50 in the peripheral circuit region PR are provided near the surface of the semiconductor substrate 100. For example, the p-type well region 20 and the p-type well region 50 are separated by the element isolation region STI. The inside of the element isolation region STI is buried with, for example, silicon oxide ($SiO_2$). The $n^+$ type diffusion layer region 51 is an n-type impurity diffusion region provided near the surface of the p-type well region 50 and corresponds to the source or drain of the n channel MOS transistor TR provided in the peripheral circuit region PR. The p-type well region is doped with, for example, boron (B). The $n^+$ type diffusion layer region 51 is doped with phosphorus (P), for example. The p-type well regions 20 and 50 may be provided in an n-type well region (not shown) provided near the surface of the semiconductor substrate 100.

The transistor TR provided in the peripheral circuit region PR includes a gate insulating film 60, conductor layers 61 and 62, and insulating layers 63 and 64. More specifically, the gate insulating film 60 is provided on the p-type well region 50. The conductor layers 61 and 62 and the insulating layer 63 are sequentially provided on the gate insulating film 60. Side surfaces (side walls) of the conductor layers 61 and 62 and the insulating layer 63 are covered with the insulating layer 64. The conductor layers 61 and 62 are used as gate electrodes of the transistor TR.

The contact plug CG is provided on the gate electrode (conductor layer 61) of the transistor TR. The contact plug CG has a columnar structure extending in the Z direction and penetrates the insulating layers 52, 53, 55, and 63. The contact plug CS3 is provided on the $n^+$ type diffusion layer region 51. The contact plug CS3 has a columnar structure extending in the Z direction and penetrates the insulating layers 52 to 55.

One conductor layer 29 is provided on each of the contact plugs CG and CS3. The conductor layer 29 is a wiring used for controlling the transistor TR. Other contacts or wirings may be connected to each conductor layer 29. The contact plugs CG and CS3 include, for example, tungsten (W). The conductor layer 29 contains, for example, copper (Cu).

The dummy transistors DT (DT0, DT1a, and DT1b) provided in the boundary region BR have the same gate structure as the transistor TR, but the gate electrodes are not electrically connected. Further, the dummy transistor DT is not provided with the $n^+$ type diffusion layer region 51 corresponding to the source and the drain. The dummy transistor DT0 is provided at the boundary between the boundary region BR and the memory region MR and has a structure in which the gate insulating film 60, the conductor layers 61 and 62, and the insulating layers 63 and 64 on the memory region MR side are removed. The gate of the dummy transistor DT1a is the dummy gate DGC1a, and the gate of the dummy transistor DT1b is the dummy gate DGC1b. Therefore, the dummy transistor DT1a is provided between the contact plug CS1 and the blocking portion PW1, and the dummy transistor DT1b is provided between the transistor TR in the peripheral circuit region PR and the blocking portion PW1.

The insulating layers 52 and 53 are sequentially provided so as to cover the surface of the semiconductor substrate, the element isolation region STI, and the surfaces and side surfaces of the transistor TR and the dummy transistor DT. More specifically, the insulating layer 52 covers the upper surface and the side surface of the structure corresponding to the transistor TR and the dummy transistor DT, and the upper portion of the element isolation region STI. The insulating layers 52 and 53 have portions provided along the transistor TR and the dummy transistor DT. The insulating layer 52 is, for example, $SiO_2$, and the insulating layer 53 is, for example, silicon nitride (SiN).

The insulating layer 54 is provided on the insulating layer 53. The insulating layer 54 is, for example, undoped Silicate Glass (NSG). The insulating layer 54 buries the space between the transistor TR and the dummy transistor DT and is not provided above the gates of the transistor TR and the dummy transistor DT. The insulating layer 54 is removed to a height at which the insulating layer 53 provided on the upper surfaces of the transistor TR and the dummy transistor DT is exposed, to be planarized by chemical mechanical polishing (CMP) or the like.

In the boundary region BR, the blocking portion PW1 is provided between the dummy gates DGC1a and DGC1b. In the blocking portion PW1, the insulating layers 52 to 54 are divided (removed). More specifically, a region where the insulating layers 52 and 53 are separated and the insulating layer 55 is in contact with the semiconductor substrate 100 between the dummy gates DGC1a and DGC1b corresponds to the blocking portion PW1. The width in the Y direction in which the insulating layer 54 is separated is wider than the width in the Y direction of the blocking portion PW1. In the example of FIG. 5, the insulating layer 54 remains between the dummy gates DGC1a and DGC1b, but the insulating layer 54 between the dummy gates DGC1a and DGC1b may be entirely removed.

The insulating layer 55 covers the insulating layer 54, the transistor TR and the dummy transistor DT, and the blocking portion PW1. In the blocking portion PW1, the insulating layer 55 is in contact with the semiconductor substrate 100 (p-type well region 20). In other words, the insulating layer 55 includes a first portion that covers the transistor TR and the dummy transistor DT, and a second portion that corresponds to the blocking portion PW1 and is in contact with the semiconductor substrate 100. The insulating layer 55 is, for example, SiN. For the insulating layer 55, for example, an insulating material that is less likely to permeate hydrogen and moisture than silicon oxide is preferable. The insulating layer 56 is provided on the insulating layer 55. The insulating layer 56 is, for example, silicon oxide ($SiO_2$).

The contact plug CS1 whose bottom surface contacts the p-type well region 20 is provided between the dummy transistor DT1a and the dummy transistor DT0. The contact plug CS1 has a columnar structure extending in the Z direction and penetrates the insulating layers 52 to 55. The contact plug CS1 contains, for example, W. The conductor layer 29 is provided on the contact plug CS1.

Next, the boundary region BR between the peripheral circuit region PR and the end region ER, and the end region ER will be described.

As illustrates in FIG. 6, in the boundary region BR between the peripheral circuit region PR and the end region ER, and the end region ER, the element isolation region STI, the insulating layers 52 to 56, the dummy transistors DT2a, DT2b, DT3a, and DT3b, the contact plugs CS2a and CS2b, and the conductor layer 29 are provided.

In the end region ER, the element isolation region STI used as an alignment pattern during lithography is provided in the alignment mark AM. Further, the dummy transistor DT3 having the same structure as the dummy transistors DT1a and DT1b is provided on the element isolation region STI. The element isolation region STI used as an alignment pattern and the dummy transistor DT3 may be designed in any shape on the XY plane.

The dummy transistors DT2a and DT2b provided in the boundary region BR have the same structure as the dummy transistors DT1a and DT1b. The gate of the dummy transistor DT2a is the dummy gate DGC2a, and the gate of the dummy transistor DT2b is the dummy gate DGC2b. Therefore, the dummy transistor DT2a is provided between the contact plug CS2a and the blocking portion PW2, Further, the dummy transistor DT2b is provided between the contact plug CS2b and the blocking portion PW2.

The insulating layers 52 and 53 are sequentially provided so as to cover the surface of the semiconductor substrate, and the surfaces and side surfaces of the dummy transistors DT (DT2a, DT2b, and DT3). More specifically, the insulating layer 52 covers the upper surface and side surfaces of the structure corresponding to the dummy transistor DT and the upper portion of the element isolation region STI. The insulating layers 52 and 53 have a portion provided along the dummy transistor DT.

An insulating layer 54 is provided on the insulating layer 53. The insulating layer 54 buries the space between the dummy transistors DT and is not provided above the gate of the dummy transistor DT.

In the boundary region BR, the blocking portion PW2 is provided between the dummy gates DGC2a and DGC2b. The insulating layers 52 to 54 are divided (removed) at the blocking portion PW2. More specifically, a region where the insulating layers 52 and 53 are separated and the insulating layer 55 is in contact with the semiconductor substrate 100 between the dummy gates DGC2a and DGC2b corresponds to the blocking portion PW2. The insulating layer 55 further includes a third portion corresponding to the blocking portion PW2 and in contact with the semiconductor substrate 100. The width in the Y direction in which the insulating layer 54 is separated is wider than the width in the Y direction of the blocking portion PW2. In the example of FIG. 6, in the Y direction, the distance between the dummy transistor DT2a and the blocking portion PW2 is shorter than the distance between the dummy transistor DT2b and the blocking portion PW2. Therefore, the insulating layer 54 does not remain between the dummy gate DGC2a and the blocking portion PW2, but the insulating layer 54 remains between the dummy gate DGC2b and the blocking portion PW2. As in FIG. 5, the insulating layer 54 may remain between the dummy gate DGC2a and the blocking portion PW2 and between the dummy gate DGC2b and the blocking portion PW2, and the insulating layer 54 between the dummy gate DGC2a and the dummy gate DGC2b may be entirely removed.

The insulating layers 52 and 53 are separated in the alignment mark AM in the end region ER. Further, the insulating layer 54 is not provided inside the alignment mark AM.

The insulating layer 55 covers the insulating layer 54, the dummy transistor DT, the blocking portion PW2, and the alignment mark AM. The insulating layer 55 is in contact with the semiconductor substrate 100 at a part of the blocking portion PW2 and the alignment mark AM. The insulating layer 55 further includes a fourth portion corresponding to the alignment mark AM and is in contact with the semiconductor substrate 100. The insulating layer 56 is provided on the insulating layer 55.

The contact plug CS2a whose bottom surface contacts the semiconductor substrate 100 is provided between the dummy transistor DT2a and the peripheral circuit region PR (not shown). Further, the contact plug CS2b whose bottom surface contacts the semiconductor substrate 100 is provided between the dummy transistor DT2b and the end region ER. The contact plugs CS2a and CS2b have a columnar structure extending in the Z direction and penetrate the insulating layers 52 to 55. The contact plugs CS2a and CS2b contain, for example, W. The conductor layer 29 is provided on the contact plugs CS2a and CS2b.

1.2 Configuration of Memory Cell Array

Next, the configuration of the memory cell array 10 will be described.

1.2.1 Circuit Configuration of Memory Cell Array

Figure 7:
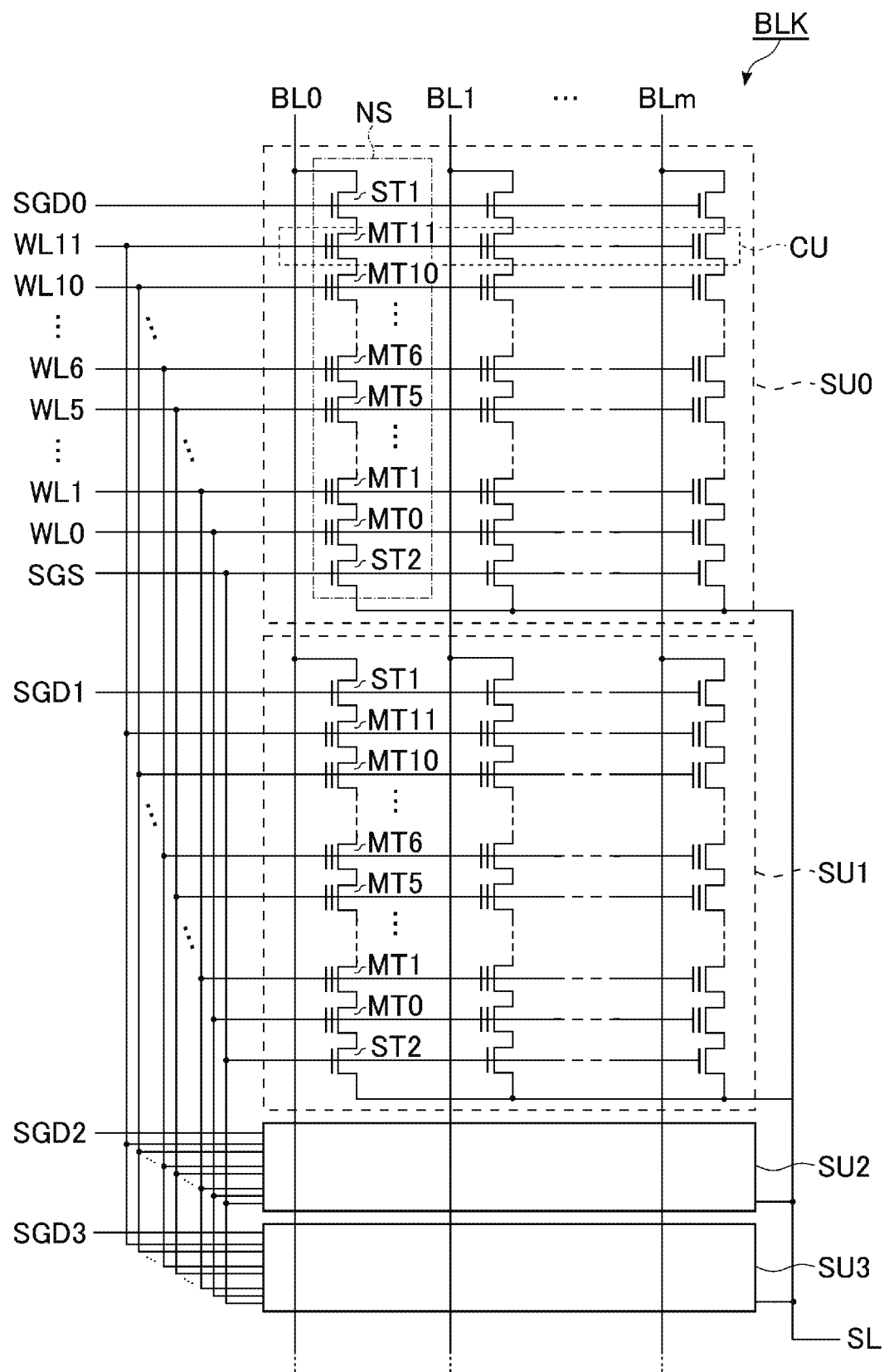
FIG. 7 is a circuit diagram of a memory cell array in the semiconductor memory device according to the first embodiment.

First, an example of the circuit configuration of the memory cell array 10 will be described with reference to FIG. 7. FIG. 7 illustrates an example of a circuit configuration of the memory cell array 10 in the semiconductor memory device 1 by extracting one block BLK from the plurality of blocks BLK in the memory cell array 10.

As illustrates in FIG. 7, the block BLK includes, for example, four string units SU0 to SU3.

Each string unit SU includes a plurality of NAND strings NS respectively associated with the bit lines BL0 to BLm (m is an integer of 1 or more). Each NAND string NS includes, for example, memory cell transistors MT0 to MT11 and select transistors ST1 and ST2. The memory cell transistor MT includes a control gate and a charge storage layer, and stores data in a nonvolatile manner. Each of the select transistors ST1 and ST2 is used to select the string unit SU during various operations.

In each NAND string NS, the memory cell transistors MT0 to MT11 are connected in series. The drain of the select transistor ST1 is connected to the associated bit line BL, and the source of the select transistor ST1 is connected to one end of the memory cell transistors MT0 to MT11 connected in series. The drain of the select transistor ST2 is connected to the other end of the memory cell transistors MT0 to MT11 connected in series. The source of the select transistor ST2 is connected to the source line SL.

In the same block BLK, the control gates of the memory cell transistors MT0 to MT11 are commonly connected to the word lines WL0 to WL11, respectively. The gates of the select transistors ST1 in the string units SU0 to SU3 are commonly connected to the select gate lines SGD0 to SGD3, respectively. The gates of the select transistors ST2 are commonly connected to the select gate line SGS.

In the circuit configuration of the memory cell array 10 described above, the word lines WL0 to WL5 correspond to the holes LMH described later, and the word lines WL6 to WL11 correspond to the holes UMH described later. The bit line BL is shared by the NAND strings NS to which the same column address is assigned in each string unit SU. The source line SL is shared by, for example, a plurality of blocks BLK.

A set of a plurality of memory cell transistors MT connected to a common word line WL in one string unit SU is called, for example, a cell unit CU. For example, the storage capacity of the cell unit CU including the memory cell transistors MT that each store 1-bit data is defined as "1 page data". The cell unit CU can have a storage capacity of two page data or more depending on the number of bits of data stored in the memory cell transistor MT.

The circuit configuration of the memory cell array 10 in the semiconductor memory device 1 according to the first embodiment is not limited to the configuration described above. For example, the number of memory cell transistors MT and select transistors ST1 and ST2 in each NAND string NS may be designed to be any number. The number of string units SU in each block BLK may be designed to be any number.

Further, one or more dummy word lines may be provided between the word lines WL5 and WL6. When dummy word lines are provided, dummy transistors are provided between the memory cell transistors MT5 and MT6 of each NAND string NS in correspondence with the number of dummy word lines. The dummy transistor is a transistor that has the same structure as the memory cell transistor MT and is not used for storing data.

1.2.2 Planar Configuration of Memory Region

Figure 8:
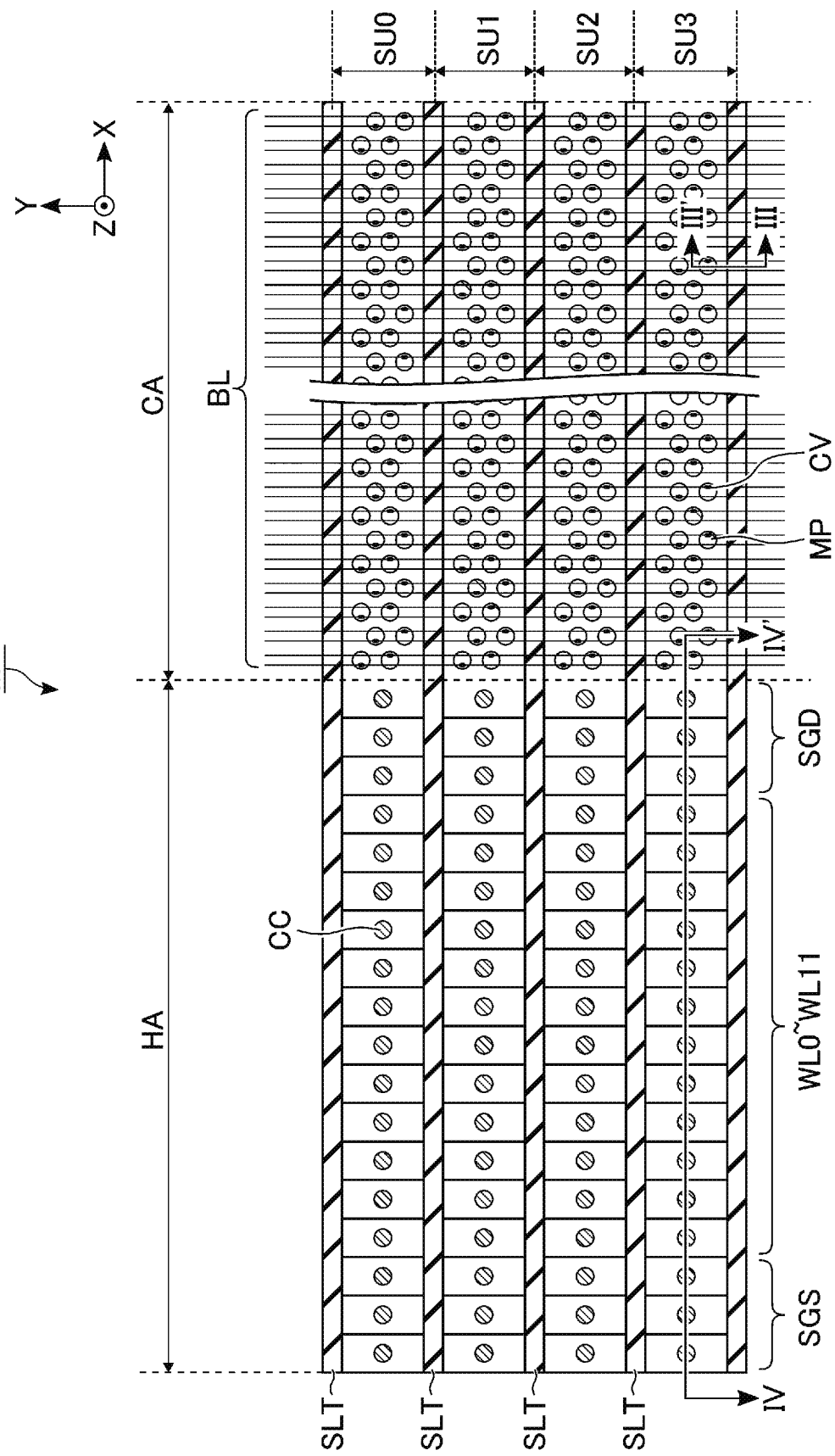
FIG. 8 is a diagram showing an example of a planar layout in a memory region of the semiconductor memory device according to the first embodiment.

Next, the planar configuration of the memory region MR will be described with reference to FIG. 8. FIG. 8 is an example of a planar layout in the memory region MR and illustrates a part of the region corresponding to one block BLK (that is, the string units SU0 to SU3).

As shown in FIG. 8, the memory region MR includes, for example, a cell area CA and a lead area HA. Further, in the memory region MR, the semiconductor memory device 1 includes a plurality of slits SLT, a plurality of memory pillars MP, and a plurality of contact plugs CV and CC.

The cell area CA and the lead area HA extend in the Y direction and are arranged in the X direction. The cell area CA occupies most of the memory region MR. The lead area HA is provided, for example, at one end of the cell area CA in the X direction. In the lead area HA, each of the select gate line SGS, the word lines WL0 to WL11, and the select gate line SGD has a portion (hereinafter referred to as "terrace portion") that does not overlap with the upper wiring layer (conductor layer). The shape of the portion that does not overlap the upper wiring layer is similar to a step or the like. The lead area HA may be provided at both ends of the cell area CA in the X direction.

Each of the plurality of slits SLT extends along the X direction and crosses the cell area CA and the lead area HA in the X direction. Further, the plurality of slits SLT are arranged in the Y direction. The slits SLT are provided in the same wiring layer and divide the conductor layers which are adjacent to each other via the slits SLT. Specifically, the slit SLT divides the plurality of wiring layers respectively corresponding to the word lines WL0 to WL11 and the select gate lines SGD and SGS.

Each memory pillar MP functions as, for example, one NAND string NS. For example, the plurality of memory pillars MP are arranged in a zigzag pattern in four rows in the cell area CA and in the region between two adjacent slits SLT. The number and the arrangement of the memory pillars MP between the two adjacent slits SLT are not limited thereto and may be appropriately changed.

The plurality of bit lines BL have at least a part of each of which extends in the Y direction, and are arranged in the X direction. Each bit line BL overlaps with at least one memory pillar MP for each string unit SU. In this example, two bit lines BL are arranged above each memory pillar MP. The contact plug CV is provided between one of the plurality of bit lines BL arranged above the memory pillar MP and the memory pillar MP. Then, each memory pillar MP is electrically connected to the corresponding bit line BL via the contact plug CV.

Each contact plug CC is used for connection between the word lines WL0 to WL11, the select gate lines SGS and SGD, and the row decoder module 16. In the example of FIG. 8, one contact plug CC is arranged on each terrace portion of the word lines WL0 to WL11 and the select gate lines SGS and SGD in the lead area HR.

In the planar layout of the memory cell array 10 in the embodiment described above, each of the regions partitioned by the slit SLT corresponds to one string unit SU. That is, in this example, the string units SU0 to SU3 each extending in the X direction are arranged in the Y direction. Then, in the memory region MR, for example, the layout illustrated in FIG. 8 is repeatedly arranged in the Y direction corresponding to each block BLK.

In the example shown in FIG. 8, the string units SU corresponding to the same block BLK are divided by the slit SLT. In this case, the word lines WL and the select gate lines SGS corresponding to the same block BLK and are provided in the same wiring layer are electrically connected through different wiring layers. The disclosure is not limited thereto, and the slits SLT sandwiched between the slits SLT corresponding to the boundaries of the blocks BLK may at least divide the select gate line SGD. In this case, the word lines WL provided in the same wiring layer in the same block BLK are continuously provided in the lead area HR and electrically connected.

1.2.2 Cell Area Cross-section Configuration

Figure 9:
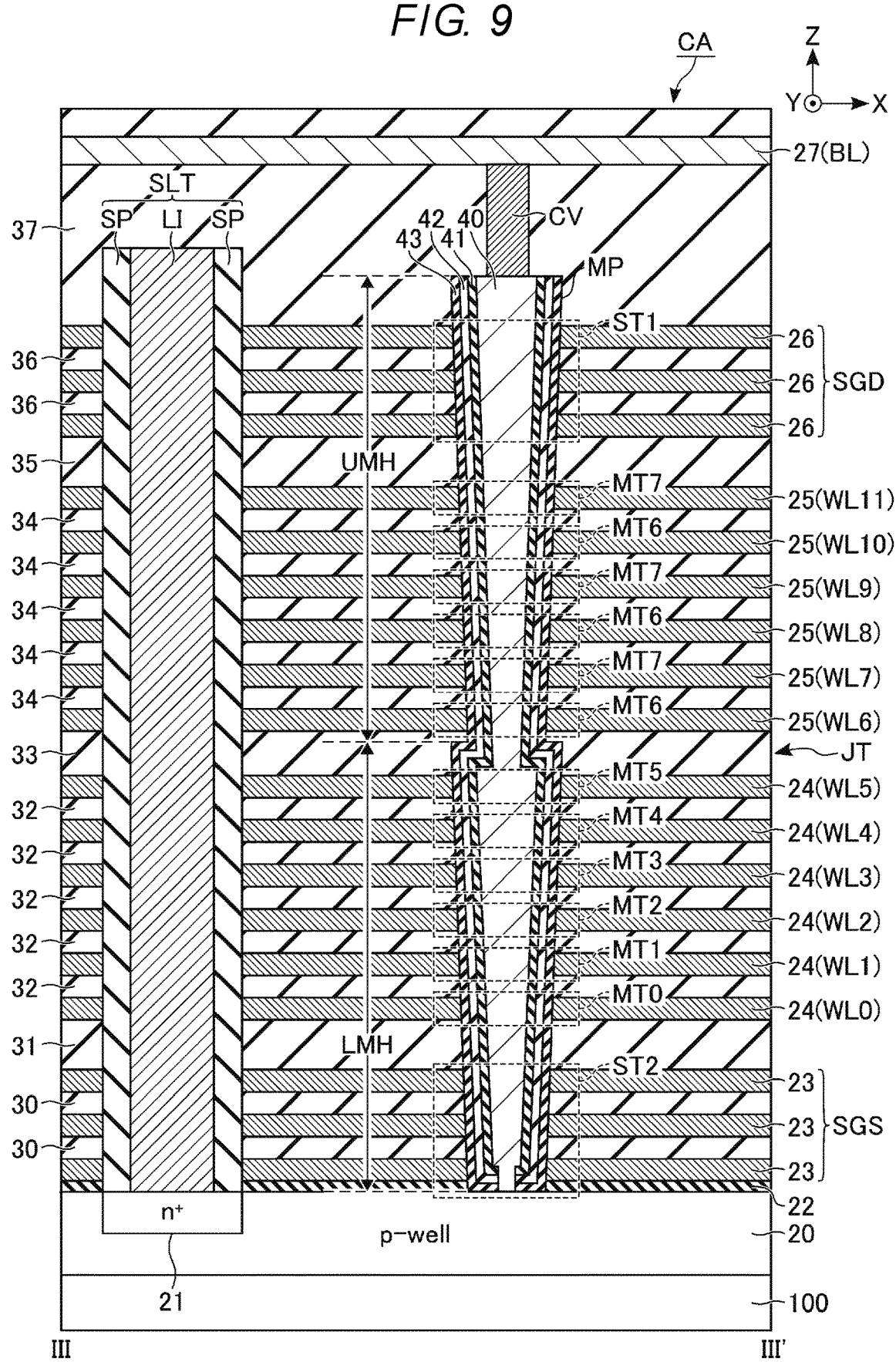
FIG. 9 is a cross-sectional view taken along line of FIG. 8.

Next, the cross-sectional configuration of the cell area CA will be described with reference to FIG. 9. FIG. 9 is an example of a cross-sectional structure taken along line II-II' of FIG. 8 and illustrates a cross section taken along the Y direction including the memory pillar MP.

As shown in FIG. 9, in the cell area CA, the semiconductor memory device 1 includes the p-type well region 20, the $n^+$ type diffusion layer region 21, an insulating layer 22, and conductor layers 23 to 27.

The p-type well region 20 is provided near the surface of the semiconductor substrate 100. The $n^+$ type diffusion layer region 21 is an n-type impurity diffusion region provided near the surface of the p-type well region 20. The $n^+$ type diffusion layer region 21 is doped with phosphorus, for example.

The insulating layer 22 is provided on the p-type well region 20. The conductor layers 23 and insulating layers 30 are alternately stacked on the insulating layer 22. The conductor layer 23 is formed, for example, in a plate shape that extends along the XY plane. The plurality of stacked conductor layers 23 are used as select gate lines SGS.

An insulating layer 31 is provided on the uppermost conductor layer 23. The conductor layers 24 and insulating layers 32 are alternately stacked on the insulating layer 31. The conductor layer 24 is formed, for example, in a plate shape that extends along the XY plane. The plurality of stacked conductor layers 24 are used as word lines WL0 to WL5 in order from the p-type well region 20 side.

An insulating layer 33 is provided on the uppermost conductor layer 24. The conductor layers 25 and insulating layers 34 are alternately stacked on the insulating layer 33. The conductor layer 25 is formed, for example, in a plate shape that extends along the XY plane. The plurality of stacked conductor layers 25 are used as word lines WL6 to WL11 in order from the p-type well region 20 side.

An insulating layer 35 is provided on the uppermost conductor layer 25. The conductor layers 26 and insulating layers 36 are alternately stacked on the insulating layer 35. The conductor layer 26 is formed, for example, in a plate shape that extends along the XY plane. The plurality of stacked conductor layers 26 are used as select gate lines SGD.

An insulating layer 37 is provided on the uppermost conductor layer 26. The conductor layer 27 is provided on the insulating layer 37. The conductor layer 27 is formed, for example, in a line shape extending in the Y direction and is used as the bit line BL. That is, the plurality of conductor layers 27 may be arranged along the X direction in a region not shown.

The conductor layers 23 to 26 contain, for example, tungsten. The conductor layer 27 contains, for example, copper. Silicon oxide ($SiO_2$) is used for the insulating layers 22 and 30 to 37, for example.

The memory pillar MP extends along the Z direction and penetrates the conductor layers 23 to 26. In addition, each of the memory pillars MP has a first portion formed in the lower hole LMH and a second portion formed in the upper hole UMH.

Specifically, the first portion of the memory pillar MP corresponding to the hole LMH penetrates the conductor layers 23 and 24, and the bottom portion thereof is in contact with the p-type well region 20. The second portion of the memory pillar MP corresponding to the hole UMH is provided on the first portion of the memory pillar MP and penetrates the conductor layers 25 and 26. A boundary portion between the first portion and the second portion of the memory pillar MP is also called a junction JT. The memory pillar MP may have a structure in which the outer diameter is increased at the junction JT. Hereinafter, the stacked structure in which the first portion of the memory pillar MP penetrates is referred to as a lower layer portion, and the stacked structure in which the second portion of the memory pillar MP penetrates is referred to as an upper layer portion.

Further, each of the memory pillars MP may include, for example, a semiconductor layer 40, a tunnel insulating film 41, an insulating layer 42, and a block insulating film 43. Each of the semiconductor layer 40, the tunnel insulating film 41, the insulating layer 42, and the block insulating film 43 is continuously provided between the first portion and the second portion of the memory pillar MP.

Specifically, the semiconductor layer 40 extends along the Z direction. For example, the upper end of the semiconductor layer 40 is provided in a layer above the uppermost conductor layer 26, and the lower end of the semiconductor layer 40 is in contact with the p-type well region 20. The tunnel insulating film 41 covers the side surface of the semiconductor layer 40. The insulating layer 42 covers the side surface of the tunnel insulating film 41. The block insulating film 43 covers the side surface of the insulating layer 42.

In the structure of the memory pillar MP described above, the intersection of the memory pillar MP and the conductor layer 23 functions as the select transistor ST2. The intersection of the memory pillar MP and the conductor layer 24 and the intersection of the memory pillar MP and the conductor layer 25 each function as the memory cell transistor MT. The intersection of the memory pillar MP and the conductor layer 26 functions as the select transistor ST1. That is, the semiconductor layer 40 functions as the channels of the memory cell transistors MT0 to MT11 and the select transistors ST1 and ST2. The insulating layer 42 functions as a charge storage layer of the memory cell transistor MT.

The columnar contact plug CV is provided on the semiconductor layer 40 in the memory pillar MP. One conductor layer 27, that is, one bit line BL is in contact with the upper surface of the contact plug CV. As described above, one contact plug CV is connected to one conductor layer 27 (one bit line BL) in each of the spaces partitioned by the slit SLT. The contact plug CV contains, for example, tungsten.

The slit SLT is formed in a plate shape in which at least a part thereof spreads along the XZ plane and divides the insulating layer 22, the conductor layers 23 to 26, and the insulating layers 30 to 36. The upper end of the slit SLT is provided in a layer between the uppermost conductor layer 26 and the conductor layer 27. The lower end of the slit SLT is in contact with the n$^+$ type diffusion layer region 21 in the p-type well region 20. The slit SLT may include, for example, a contact LI and a spacer SP.

The contact LI may be formed in a plate shape in which at least apart thereof spreads along the XZ plane. The bottom of the contact LI is electrically connected to the n$^+$ type diffusion layer region 21. The contact LI is used as the source line SL. The contact LI may be a semiconductor or a metal. The spacer SP covers the side surface of the contact LI. The contact LI and each of the conductor layers 23 to 26 and the insulating layers 30 to 36 are separated by the spacer SP. That is, the contact LI and the plurality of wiring layers adjacent to the slit SLT are insulated by the spacer SP. As the spacer SP, an insulator such as silicon oxide (SiO$_2$) or silicon nitride (SiN) may be used.

1.2.3 Planar Configuration of Memory Pillar MP

Figure 10:
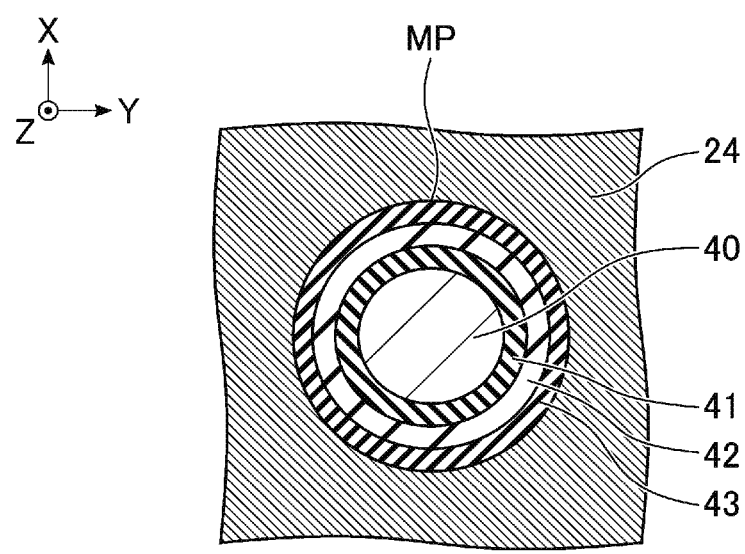
FIG. 10 is a plan view of a memory pillar in the semiconductor memory device according to the first embodiment.

Next, the planar configuration of the memory pillar MP will be described with reference to FIG. 10. FIG. 10 illustrates an example of a planar structure of the memory pillar MP. More specifically, FIG. 10 illustrates a cross-sectional structure of the memory pillar MP in a layer parallel to the surface of the semiconductor substrate 100 and including the conductor layer 24.

As shown in FIG. 10, in the layer including the conductor layer 24, the semiconductor layer 40 is provided, for example, in the central portion of the memory pillar MP. The tunnel insulating film 41 surrounds the periphery of the semiconductor layer 40. The insulating layer 42 surrounds the periphery of the tunnel insulating film 41. The block insulating film 43 surrounds the periphery of the insulating layer 42. The conductor layer 24 surrounds the periphery of the block insulating film 43. Each of the tunnel insulating film 41 and the block insulating film 43 contains, for example, silicon oxide (SiO$_2$). The insulating layer 42 contains, for example, silicon nitride (SiN). Each memory pillar MP may further include an insulating layer inside the semiconductor layer 40, and the insulating layer may be located in the central portion of the memory pillar MP.

1.2.4 Cross-sectional Configuration of Lead Area

Figure 11:
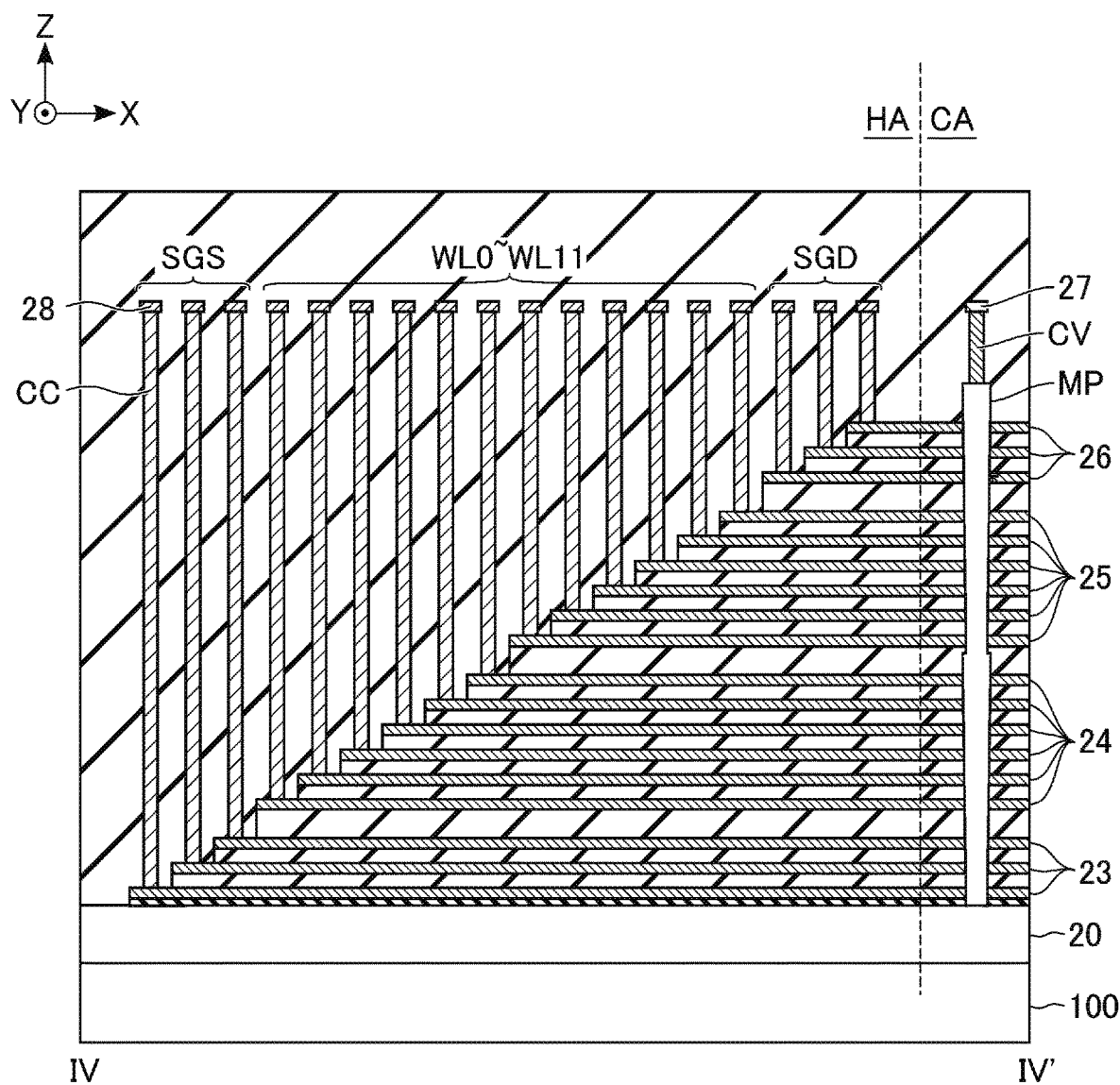
FIG. 11 is a cross-sectional view taken along line IV-IV' of FIG. 8.

Next, the cross-sectional configuration of the lead area HA will be described with reference to FIG. 11. FIG. 11 is an example of a cross-sectional structure taken along line III-III' of FIG. 8 and illustrates a cross section taken along the X direction of the lead area HA. FIG. 11 also illustrates a part of the cell area CA.

As shown in FIG. 11, in the lead area HA, for example, the respective ends of the select gate line SGS, the word lines WL0 to WL11, and the select gate line SGD are provided in a stepped shape having a step in the X direction. In addition, the plurality of contact plugs CC are provided on the respective terrace portions of the conductor layers 23 corresponding to the select gate lines SGS, the plurality of conductor layers 24 corresponding to the word lines WL0 to WL5, the plurality of conductor layers 25 corresponding to the word lines WL6 to WL11, and the plurality of conductor layers 26 corresponding to the select gate lines SGD.

One conductor layer 28 is provided on each contact plug CC. Each conductor layer 28 is electrically connected to the row decoder module 16 via a region not shown. That is, each of the conductor layers 23 to 26 is electrically connected to the row decoder module 16 via the contact plug CC and the conductor layer 28. The conductor layer 28 only needs to be at least in a layer above the uppermost conductor layer 26 and may be provided in the same wiring layer as the conductor layer 27.

In the lead area HA, the stacked wiring may have a step in the Y direction. For example, the number of steps formed in the Y direction at the ends of the stacked word lines WL may be any number. That is, in the semiconductor memory device 1, the end portion of the word line WL in the lead area HA may be designed in a stepped shape with any number of columns.

1.3 Method of Manufacturing Blocking Portion

Next, a method of manufacturing the blocking portions PW1 and PW2 will be described with reference to FIGS. 12 to 14. In at least one embodiment, a case will be described in which the processing of the insulating layer 54 in the blocking portions PW1 and PW2 and the processing of the insulating layer 54 in the alignment mark AM are performed collectively. The examples of FIGS. 12 to 14 illustrates the cross-sectional structures of the blocking portion PW2 and the alignment mark AM corresponding to FIG. 6, but the blocking portion PW1 is also the same.

Figure 12:
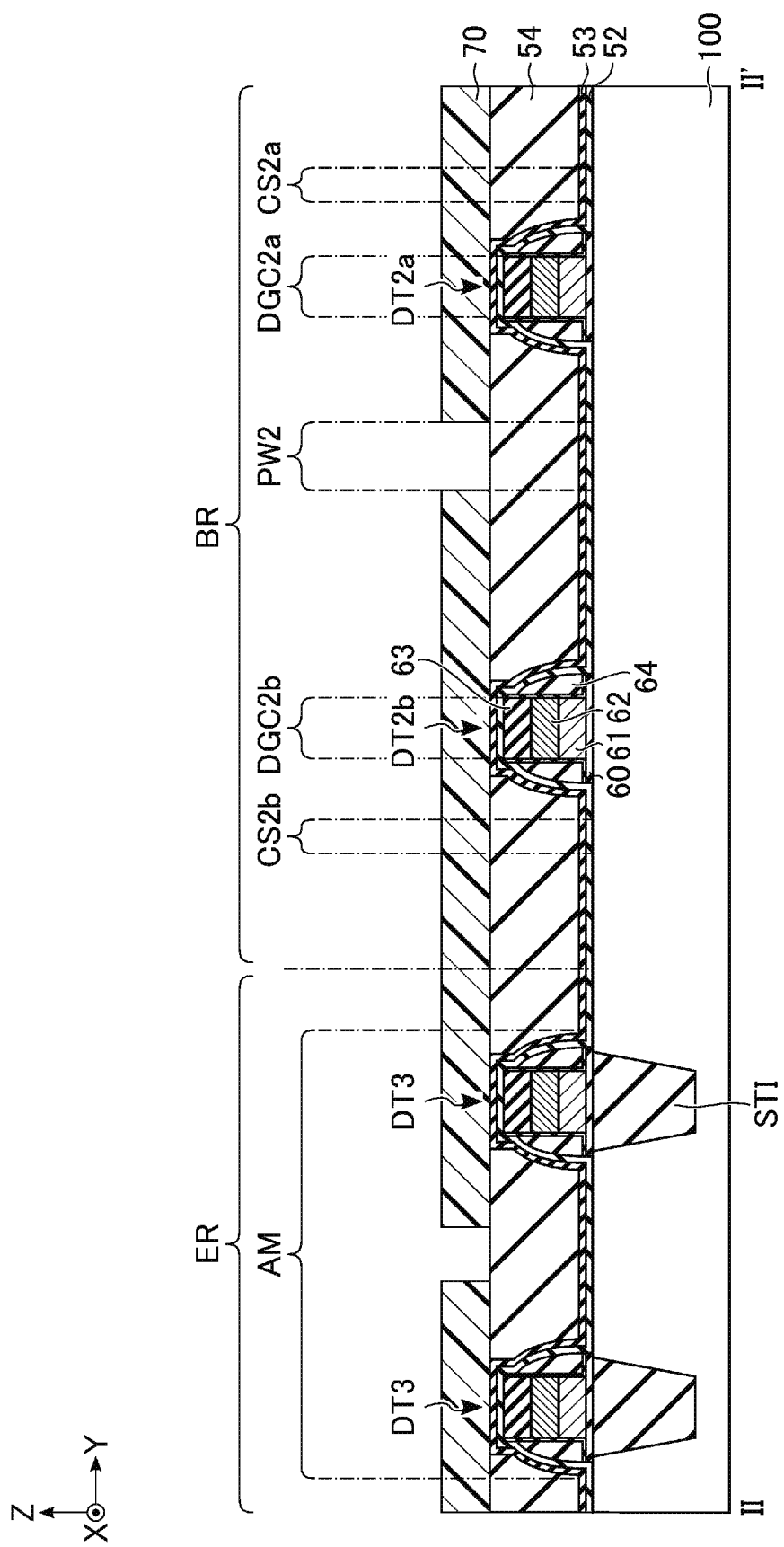
FIG. 12 is a cross-sectional view illustrating a manufacturing process of the semiconductor memory device according to the first embodiment.

As shown in FIG. 12, first, insulating layers 52 to 54 cover the dummy transistor DT (and the transistor TR not shown) provided on the semiconductor substrate 100. Next, the insulating layer 54 is planarized by, for example, CMP. At this time, the insulating layer 54 on the gate of the dummy transistor DT is removed. Next, a mask pattern of a resist 70 is formed in order to process the blocking portions PW1 and PW2 and the alignment mark AM. In at least one embodiment, the blocking portions PW1 and PW2 and the alignment mark AM are collectively processed. When the alignment mark AM is planarized by the insulating layer 54, misalignment is likely to occur in the lithography process, and thus the insulating layer 54 in the alignment mark AM is removed.

Figure 13:
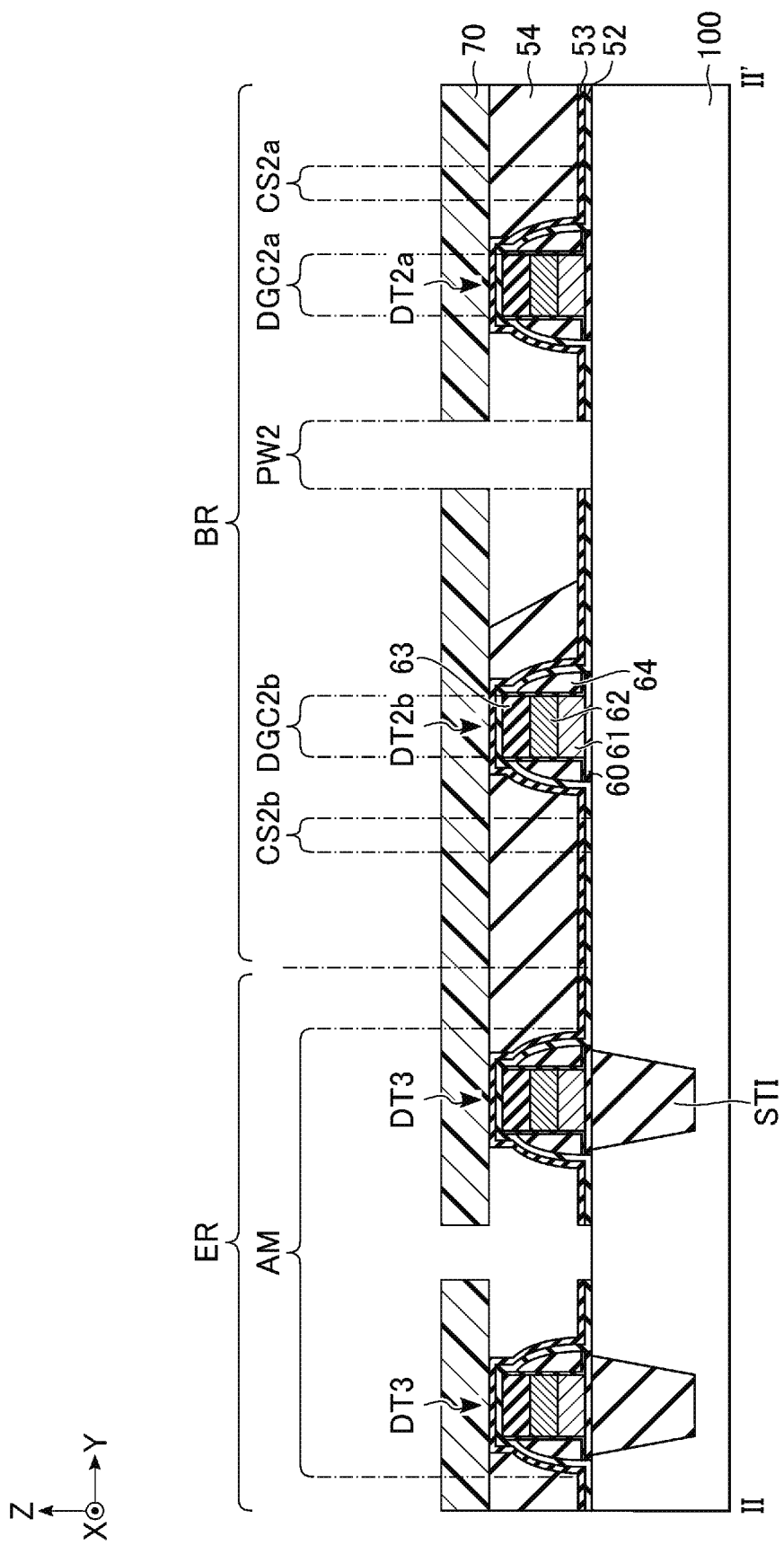
FIG. 13 is a cross-sectional view illustrating the manufacturing process of the semiconductor memory device according to the first embodiment.

As shown in FIG. 13, the insulating layers 52 to 54 are processed by reactive ion etching (RIE), and the semiconductor substrate 100 below the opening of the mask pattern is exposed. Next, the insulating layer 54 is isotropically etched from the opening of the mask pattern by wet etching. At this time, the wet etching amount is adjusted so that the insulating layer 54 in the region surrounded by the two dummy transistors DT3 is removed in the alignment mark AM. In the blocking portion PW2, the insulating layer 54 in the region surrounded by the dummy gates DGC2a and DGC2b is processed. That is, the dummy gates DGC2a and DGC2b serve as etch stoppers for wet etching, and the insulating layer 54 in the regions corresponding to the contact plugs CS2a and CS2b is not processed.

Figure 14:
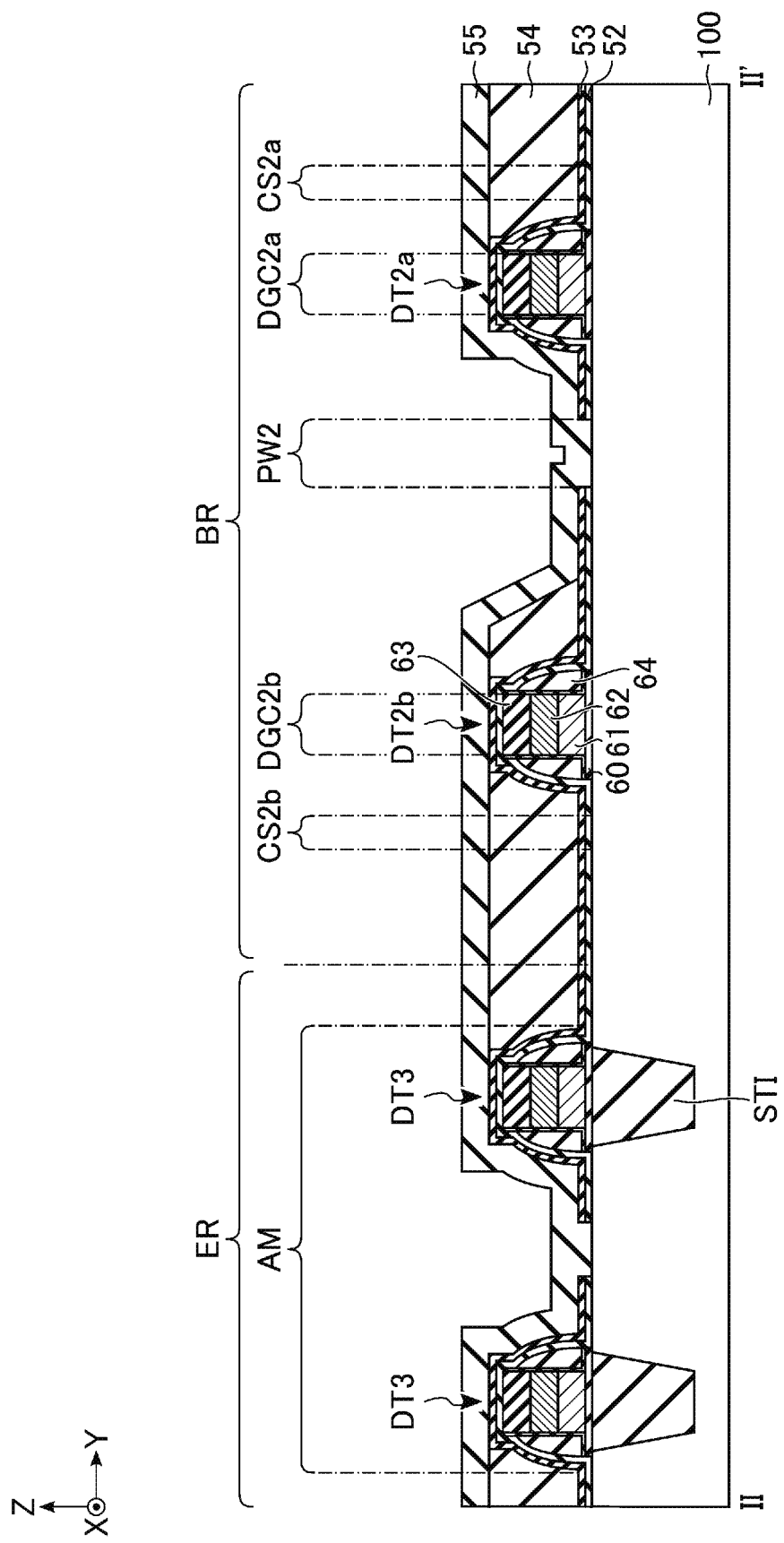
FIG. 14 is a cross-sectional view illustrating the manufacturing process of the semiconductor memory device according to the first embodiment.

As shown in FIG. 14, after removing the resist 70, the insulating layer 55 is formed.

1.4 Effects of Present Embodiment

With the configuration according to at least one embodiment, the yield of semiconductor memory devices can be improved. This effect will be described in detail.

In a semiconductor memory device in which memory cell transistors are three-dimensionally stacked, for example, after forming the transistor TR and the like in the peripheral circuit region PR, the stacked wiring of the memory cell array 10 is formed in the memory region MR. The stacked wiring can serve as a hydrogen supply source to the transistor TR during the formation process thereof. When hydrogen is supplied to the transistor TR, the transistor characteristics fluctuate, which may cause a reduction in the yield of the semiconductor memory device.

On the other hand, with the configuration according to at least one embodiment, the blocking portion PW is provided between the memory region MR and the peripheral circuit region PR and between the peripheral circuit region PR and the end region ER, and the insulating layer 55 is in contact with the semiconductor substrate 100 in the blocking portion PW. Thus, the supply path of hydrogen to the transistor TR can be reduced and the influence of hydrogen on the transistor TR can be reduced. Therefore, the yield of the semiconductor memory device can be improved.

Furthermore, with the configuration according to at least one embodiment, the blocking portion PW can be provided between the two dummy gates DGC. By providing the dummy gate DGC, the insulating layer 54 can be prevented from being processed in the formation region of the contact plugs CS (CS1, CS2a, CS2b) when the blocking portion PW and the alignment mark AM are collectively processed by wet etching.

2. Second Embodiment

Next, a second embodiment will be described. In the second embodiment, a structure of the blocking portion PW different from that of the first embodiment will be described. Hereinafter, the description will be made focusing on the points different from the first embodiment.

2.1. Planar Layout of Semiconductor Memory Device

Figure 15:
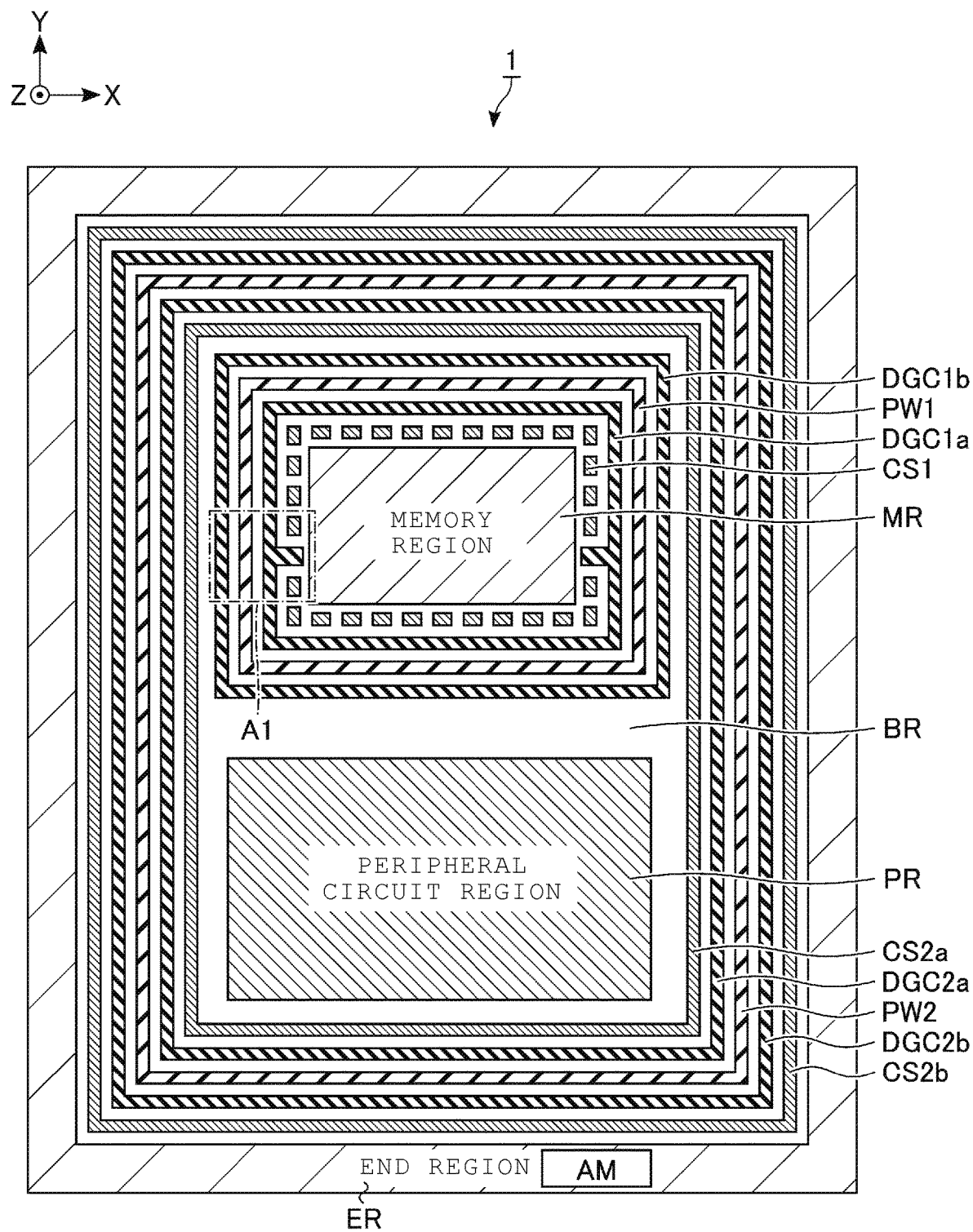
FIG. 15 is a diagram showing an example of a planar layout of a semiconductor memory device according to a second embodiment.
Figure 16:
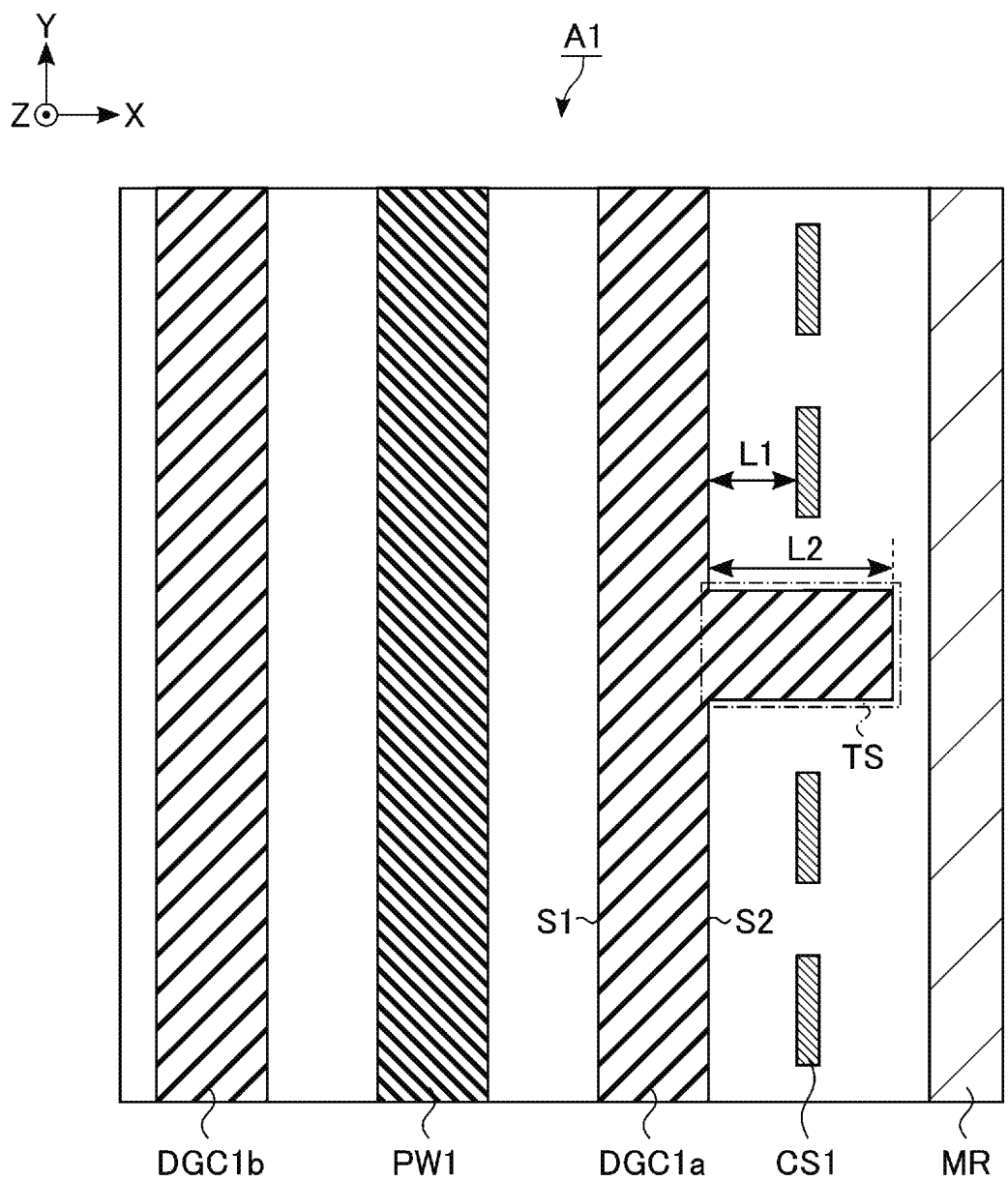
FIG. 16 is an enlarged view of the region A1 of FIG. 15.

The planar layout of the semiconductor memory device 1 will be described with reference to FIGS. 15 and 16. FIG. 15 shows an example of a planar layout of the semiconductor memory device 1. FIG. 16 illustrates the region A1 of FIG. 15.

As shown in FIG. 15, in at least one embodiment, the dummy gate DGC1a is provided with a plurality of protrusions that protrude toward the memory region MR.

As shown in FIG. 16, more specifically, a protruding portion TS is provided on a surface S2 facing a surface S1 facing the blocking portion PW1 of the dummy gate DGC1a to protrudes in a direction away from the blocking portion PW1, that is, toward the memory region MR. The protruding portion TS extends in the X direction, for example, between the two contact plugs CS1 which are arranged adjacent to the dummy gate DGC1a extending in the Y direction and separated from each other in the Y direction. If the distance between the dummy gate DGC1a and the contact plug CS1 is L1 and the length of the protruding portion TS in the X direction (direction toward the memory region MR) is L2, there is a relationship of L1<L2. The protruding portion TS may be connected to the gate of the dummy transistor DT0 described in the first embodiment with reference to FIG. 5. The number, arrangement, length, and the like of the protruding portions TS may be designed freely.

The protruding portion TS functions as an etch stopper that prevents the expansion of the etching region of the insulating layer 54 when the wet etching solution seeps out to the formation region of the contact plug CS1 in the etching process of the insulating layer 54.

For example, in the planarization of the insulating layer 54 described in the first embodiment with reference to FIG. 12, the insulating layer 54 may remain on the dummy gate DGC1a due to manufacturing variations. In this case, when the wet etching described with reference to FIG. 13 is performed, the insulating layer 54 above the dummy gate DGC1a is also removed. Therefore, the wet etching solution seeps out to the region where the contact plug CS1 is formed, and the insulating layer in the region is processed. Providing the protruding portion TS can prevent the etching region of the insulating layer 54 from expanding in the direction along the dummy gate DGC1a even if the wet etching solution seeps out to the region of the contact plug CS1. The protruding portion TS may be provided on the dummy gates DGC1b, DGC2a, and DGC2b. In this case, the protruding portion TS is provided in the direction away from the blocking portion PW adjacent to the dummy gate DGC.

2.2 Effects of Present Embodiment

With the configuration according to at least one embodiment, the same effect as that of the first embodiment can be obtained.

Furthermore, with the configuration according to at least one embodiment, the protruding portion TS can be provided in the dummy gate DGC1a. Accordingly, when the insulating layer 54 is processed by wet etching, even if the wet etching solution seeps out to the region where the contact plug CS1 is formed, it is possible to prevent the etching region of the insulating layer 54 from expanding in the region.

3. Third Embodiment

Next, a third embodiment will be described. In the third embodiment, three examples of the shapes of the contact plugs CS2a and CS2b different from those in the first embodiment will be described. Hereinafter, the description will be made focusing on the points different from the first and second embodiments.

3.1 First Example

Figure 17:
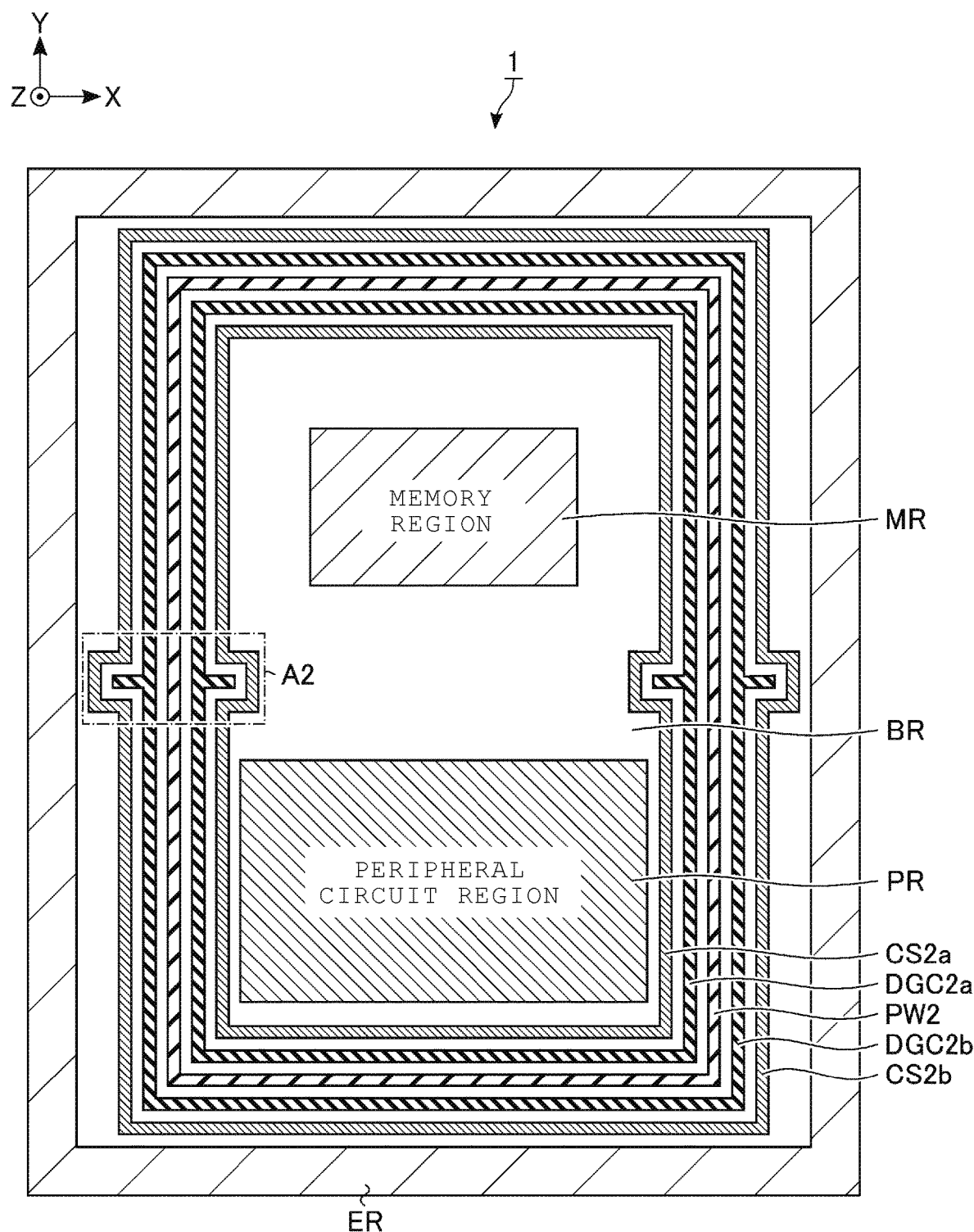
FIG. 17 is a diagram showing an example of a planar layout of the semiconductor memory device according to a first example of a third embodiment.
Figure 18:
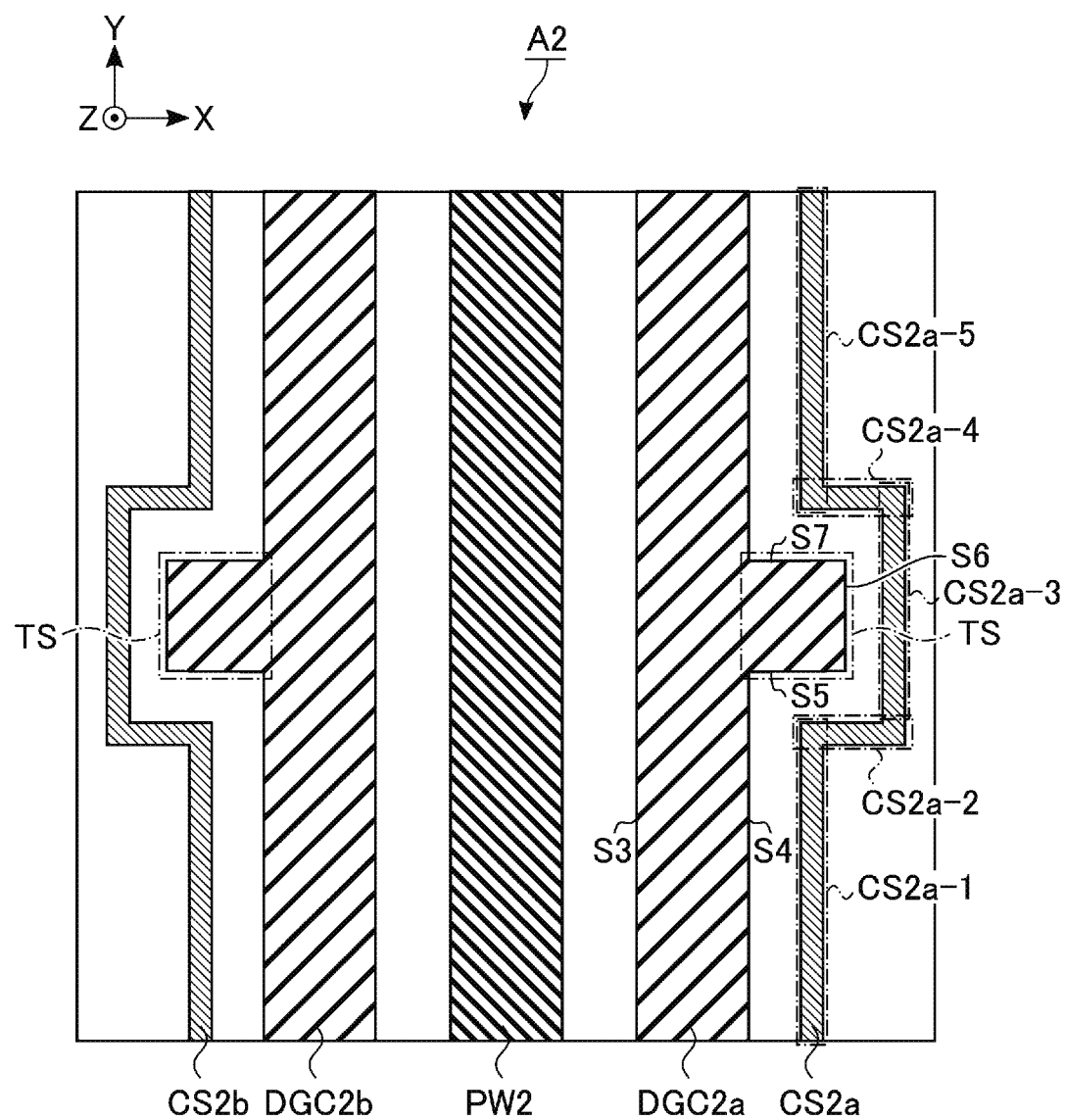
FIG. 18 is an enlarged view of the region A2 of FIG. 17.

First, the planar layout of the semiconductor memory device 1 of a first example will be described with reference to FIGS. 17 and 18. FIG. 17 illustrates an example of a planar layout of the semiconductor memory device 1. FIG. 18 illustrates the region A2 in FIG. 17. In the example of FIG. 17, the blocking portion PW1, the contact plug CS1, the dummy gates DGC1a and DGC1b, and the alignment mark AM are omitted for simplification of description.

As shown in FIG. 17, in the present example, in the dummy gates DGC2a and DGC2b, the protruding portions TS extending in the direction away from the blocking portion PW2 are provided on the surfaces that face the surfaces that face the blocking portion PW2. The contact plug CS2a is provided along the inner circumference of the dummy gate DGC2a having the protruding portion TS protruding inside the annular portion. The contact plug CS2b is provided along the outer circumference of the dummy gate DGC2b having the protruding portion TS protruding outside the annular portion (on the end region ER side).

As illustrated in FIG. 18, in the dummy gate DGC2a, the protruding portion TS that protrudes in a direction away from the blocking portion PW2 (X direction in the example of FIG. 18) is provided on a surface S4 facing a surface S3 facing the blocking portion PW2 extending in the Y direction, for example. The contact plug CS2a is provided with a bent portion that is bent in a rectangular shape, for example, along the protruding portion TS. More specifically, the contact plug CS2a includes, for example, five straight line portions CS2a-1 to CS2a-5. The straight line portion CS2a-1 is arranged, for example, to be adjacent to the surface S4 of the dummy gate DGC2a extending in the Y direction, and extends in the Y direction. The straight line portion CS2a-2 is arranged, for example, to be adjacent to one surface S5 of the protruding portion TS facing the Y direction and extends in the X direction. The straight line portion CS2a-3 is arranged, for example, to be adjacent to a surface S6 of the protruding portion TS facing the X direction and extends in the Y direction. The straight line portion CS2a-4 is arranged, for example, to be adjacent to the other surface S7 of the protruding portion TS facing the Y direction and extends in the X direction. The straight line portion CS2a-5 is arranged, for example, to be adjacent to the surface S4 of the dummy gate DGC2a extending in the Y direction and extends in the Y direction. One end of the straight line portion CS2a-2 is connected to one end of the straight line portion CS2a-1, and one end of the straight line portion CS2a-3 is connected to the other end of the straight line portion CS2a-2. One end of the straight line portion CS2a-4 is connected to the other end of the straight line portion CS2a-3, and one end of the straight line portion CS2a-5 is connected to the other end of the straight line portion CS2a-4.

In the dummy gate DGC2b, the protruding portion TS that protrudes in a direction away from the blocking portion PW2 (X direction in the example of FIG. 18) is provided on a surface facing the surface facing the blocking portion PW2 extending in the Y direction, for example. Similar to the contact plug CS2a, the contact plug CS2b is provided with a bent portion that is bent in a rectangular shape, for example, along the protruding portion TS.

The number and arrangement of the protruding portions TS in the dummy gates DGC2a and DGC2b may be designed freely. Further, the bent portions of the contact plugs CS2a and CS2b corresponding to the protruding portion TS may have an arc shape and may be designed in any shape.

3.2. Second Example

Figure 19:
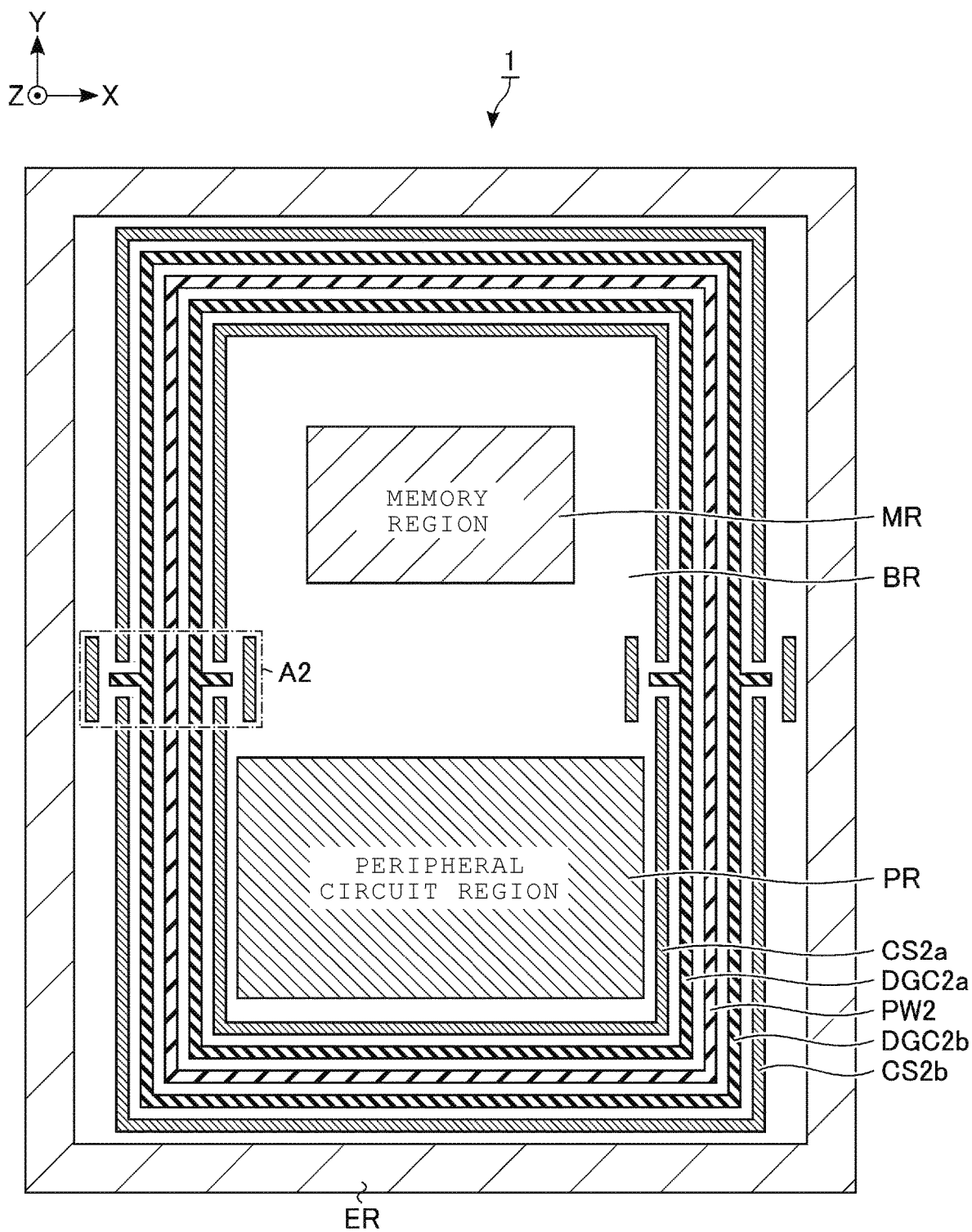
FIG. 19 is a diagram showing an example of a planar layout of a semiconductor memory device according to a second example of the third embodiment.
Figure 20:
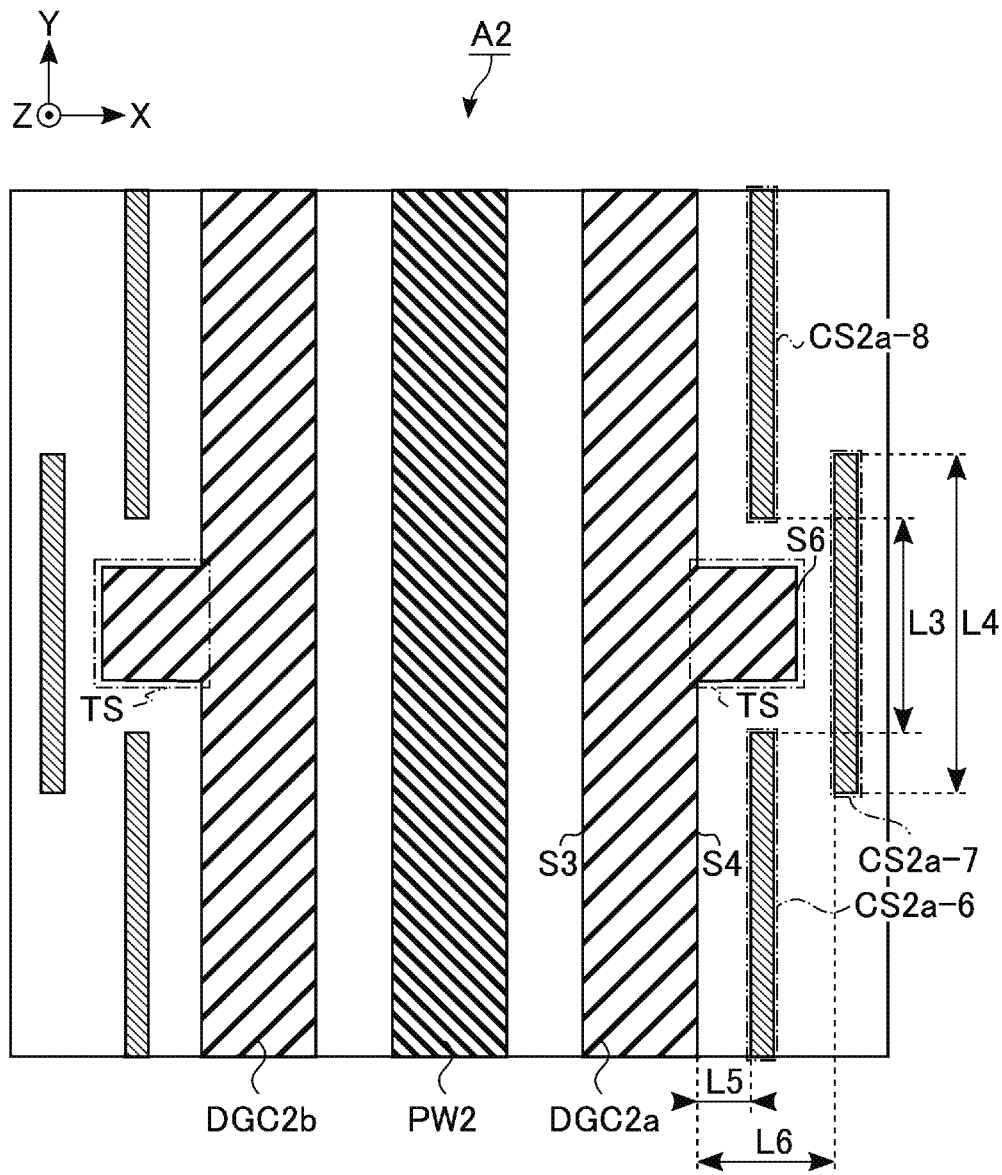
FIG. 20 is an enlarged view of the region A2 of FIG. 19.

Next, a planar layout of the semiconductor memory device 1 of a second example will be described with reference to FIGS. 19 and 20. FIG. 19 shows an example of a planar layout of the semiconductor memory device 1. FIG. 20 shows the region A2 of FIG. 19. In the example of FIG. 19, the blocking portion PW1, the contact plug CS1, the dummy gates DGC1a and DGC1b, and the alignment mark AM are omitted for simplification of description.

As shown in FIG. 19, in this example, similarly to the first example, the protruding portions TS are provided on the side surfaces of the dummy gates DGC2a and DGC2b that face the blocking portion PW2. The contact plug CS2a is provided along the inner circumference of the dummy gate DGC2a having the protruding portion TS that protrudes inside the annular portion, and a part thereof is divided and arranged. Similarly, the contact plug CS2b is provided along the outer circumference of the dummy gate DGC2b having the protruding portion TS that protrudes to the outside of the annular portion, and a part thereof is divided and arranged.

Since the contact plugs CS2a and CS2b are separated, the insulating layer 56 is not separated by the contact plugs CS2a and CS2b.

As illustrated in FIG. 20, in the dummy gate DGC2a, for example, the protruding portion TS that protrudes in a direction away from the blocking portion PW2 is provided on the surface S4 facing the surface S3 facing the blocking portion PW2 of the annular portion extending in the Y direction. The contact plug CS2a is divided by the protruding portion TS, and contact plugs that are separated from each other are provided along the protruding portion TS. More specifically, the contact plug CS2a includes three straight line portions CS2a-6 to CS2a-8. The straight line portions CS2a-6 and CS2a-8 are arranged, for example, to be adjacent to the surface S4 of the dummy gate DGC2a extending in the Y direction and extend in the Y direction. The protruding portion TS is arranged between the straight line portion CS2a-6 and the straight line portion CS2a-8. The straight line portion CS2a-7 extends in the Y direction and is adjacent to the surface S6 of the protruding portion TS facing the X direction.

If the distance between the straight line portion CS2a-6 and the straight line portion CS2a-8 is L3 and the length of the straight line portion CS2a-7 in the Y direction is L4, there is a relationship of L3<L4. By making the length L4 longer than the distance L3, it is possible to have a function as an etch stopper against cracks generated in the end region ER and peeling of the interlayer insulating film and the like. If the distance between the surface S4 of the dummy gate DGC2a on which the protruding portion TS is provided and the straight line portions CS2a-6 and CS2a-8 is L5, and the distance between the surface S4 and the straight line portion CS2a-6 is L6, there is a relationship of L5<L6.

In the dummy gate DGC2b, for example, the protruding portion TS that protrudes in a direction away from the blocking portion PW2 is provided on a surface facing a surface facing the blocking portion PW2 extending in the Y direction. Similar to the contact plug CS2a, the contact plug CS2b is provided with contact plugs spaced apart along the protruding portion TS.

The number and arrangement of the protruding portions TS in the dummy gates DGC2a and DGC2b may be designed freely. Further, the straight line portion CS2a-7 may have an arc shape and may be designed in any shape.

3.3. Third Example

Figure 21:
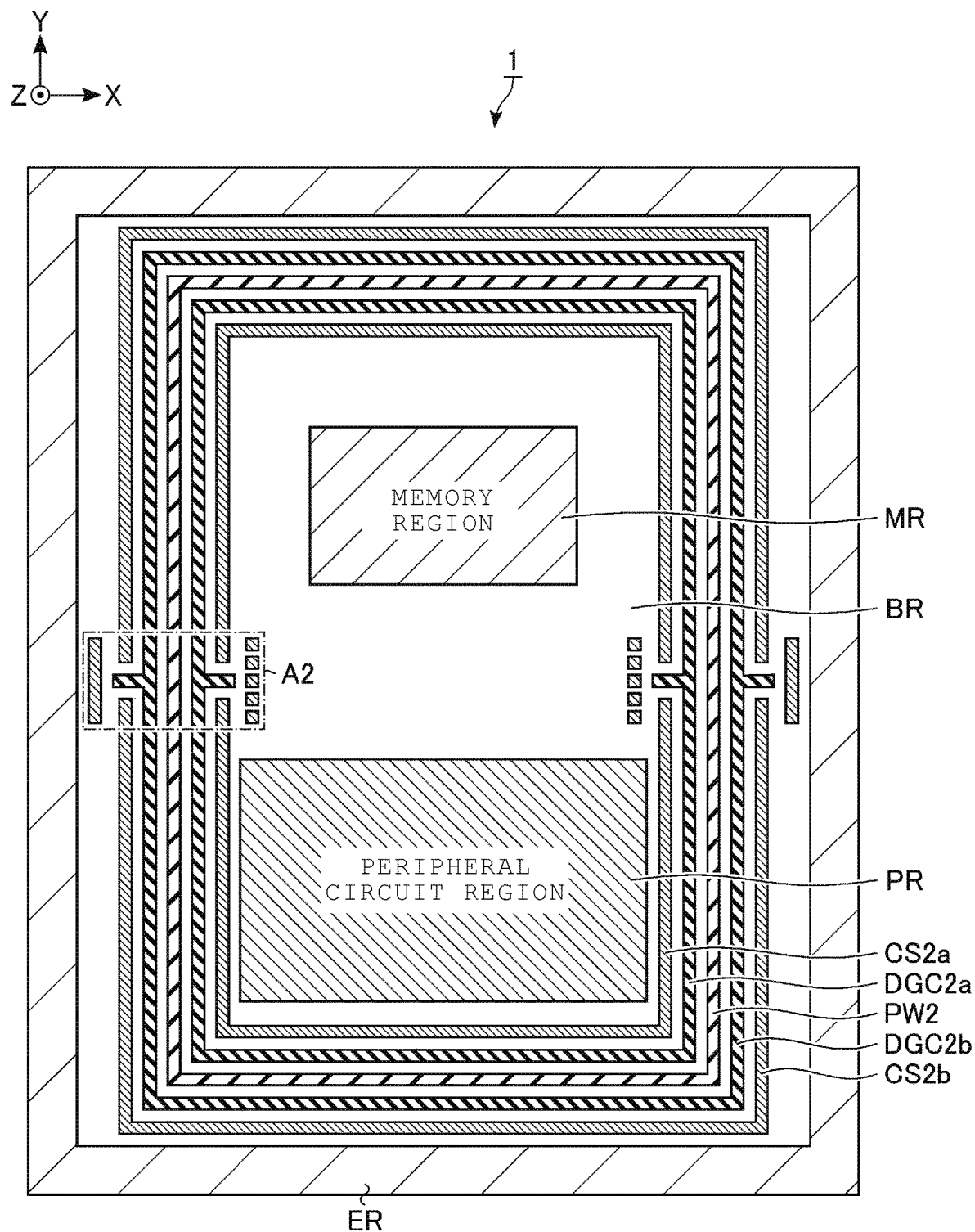
FIG. 21 is a diagram showing an example of a planar layout of a semiconductor memory device according to a third example of the third embodiment.
Figure 22:
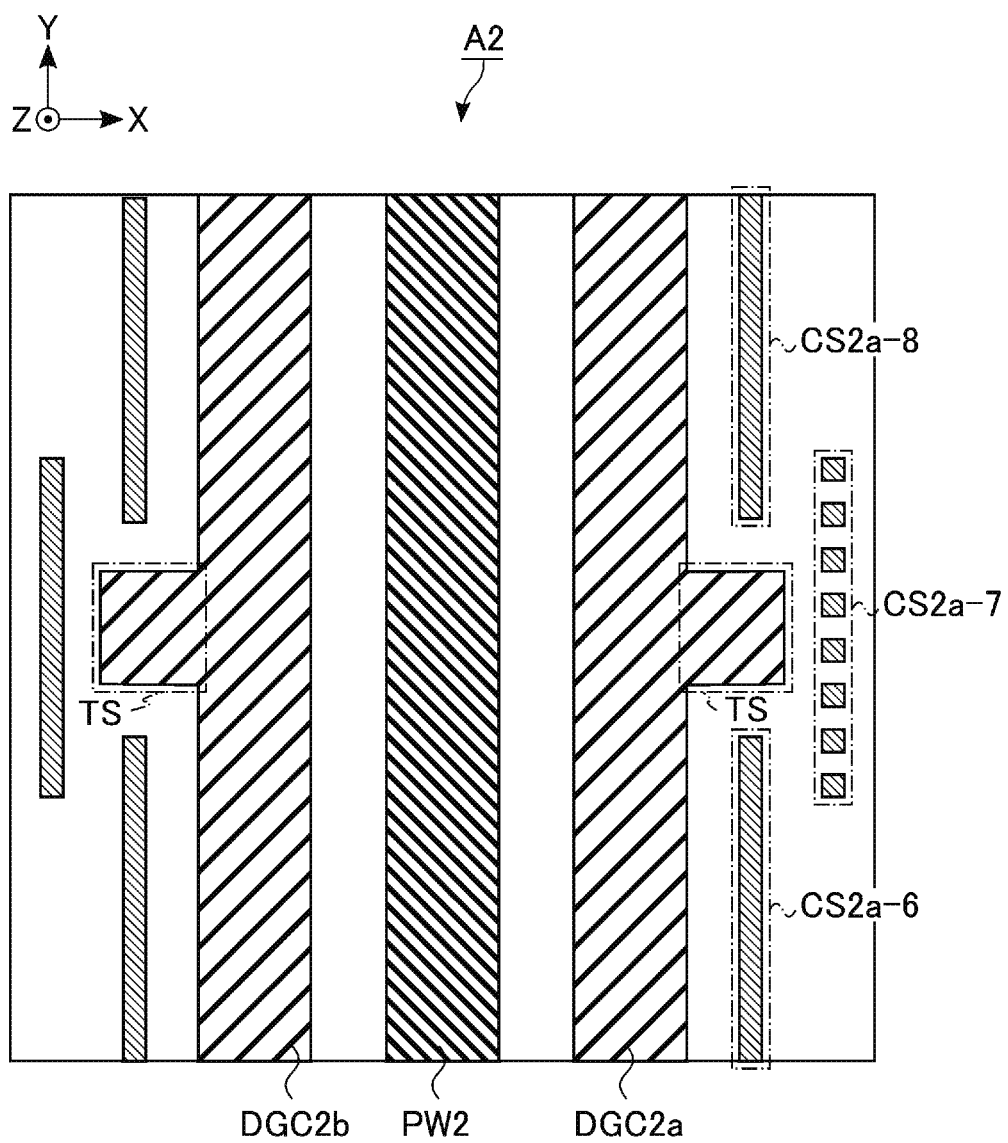
FIG. 22 is an enlarged view of the region A2 of FIG. 21.

Next, the planar layout of the semiconductor memory device 1 of the third example will be described with reference to FIGS. 21 and 22. FIG. 21 shows an example of a planar layout of the semiconductor memory device 1. FIG. 22 shows the region A2 of FIG. 21. In the example of FIG. 21, the blocking portion PW1, the contact plug CS1, the dummy gates DGC1a and DGC1b, and the alignment mark AM are omitted for simplification of description.

As shown in FIG. 21, unlike the second example, the straight line portion CS2a-7 of the contact plug CS2a is divided into a plurality. Other configurations are the same as those in the second example.

As shown in FIG. 22, in this example, the straight line portion CS2a-7 described in the second example with reference to FIG. 20 is divided into a plurality (eight in this example) and arranged along the Y direction.

The number and arrangement of divisions of the straight line portion CS2a-7 may be designed freely.

3.4 Effects of Present Embodiment

With the configuration according to at least one embodiment, the same effects as those of the first and second embodiments can be obtained.

Further, in the configurations according to the second example and the third example of at least one embodiment, the contact plugs CS2a and CS2b have a divided structure. As a result, the insulating layer 56 is not divided by the contact plugs CS2a and CS2b. Therefore, for example, when the insulating layer 56 is processed to form the contact plugs CS2a and CS2b and the like, the insulating layer 56 can be prevented from being charged up and causing a potential difference between the divided insulating layers 56 to cause arcing. Therefore, the yield of the semiconductor memory device can be improved.

The examples of the third embodiment may be combined as much as possible. For example, the structure of the first example may be applied to the contact plug CS2a, and the structure of the second example may be applied to the contact plug CS2b. Further, the structures of the first to third examples may be combined and applied to one contact plug CS2a or CS2b.

4. Fourth Embodiment

Next, a fourth embodiment will be described. In the fourth embodiment, a case where the dummy gates DGC2a and DGC2b are eliminated will be described. Hereinafter, the description will be made focusing on the points different from the first to third embodiments.

4.1. Planar Layout of Semiconductor Memory Device

Figure 23:
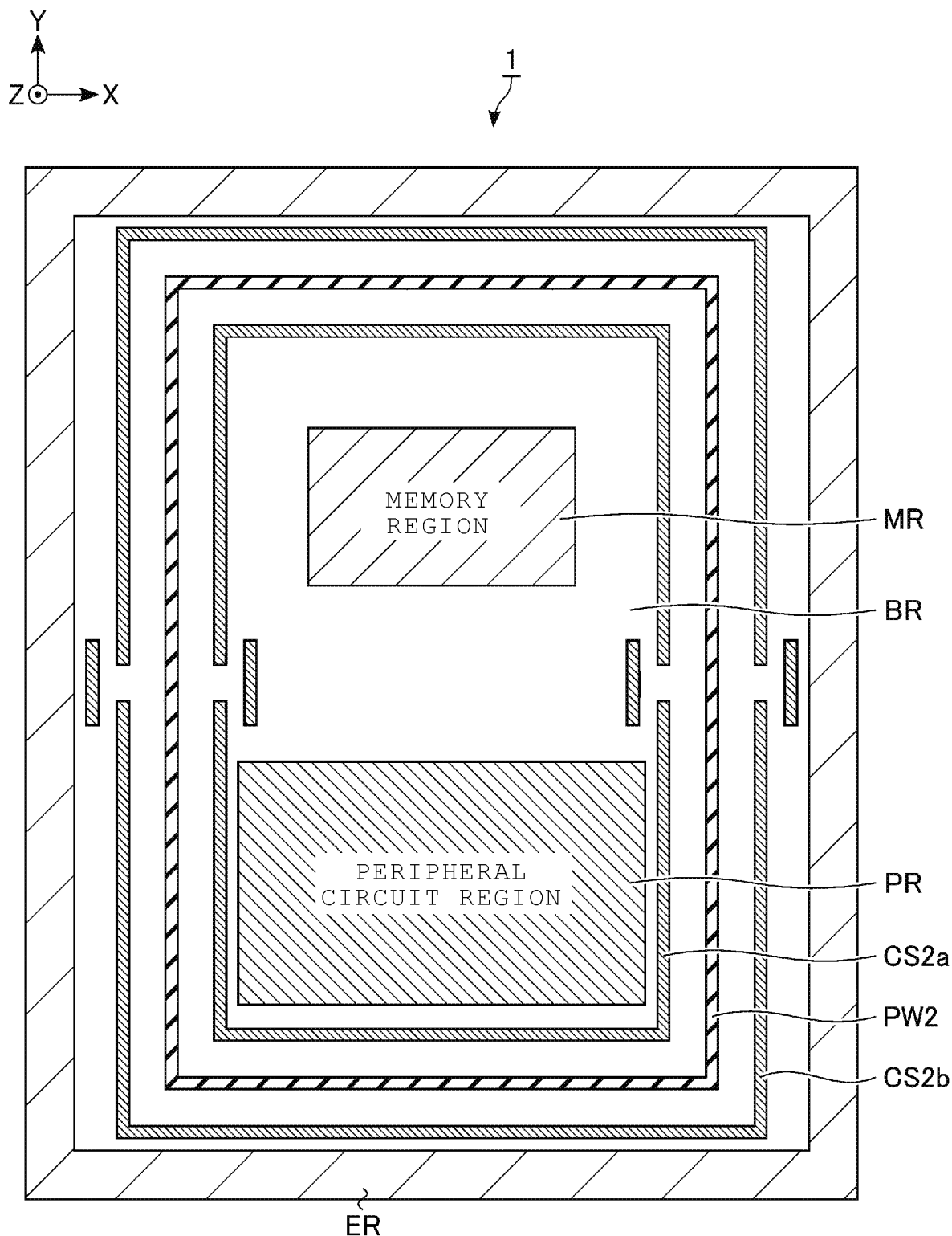
FIG. 23 is a diagram illustrating an example of a planar layout of a semiconductor memory device according to a fourth embodiment.

The planar layout of the semiconductor memory device 1 will be described with reference to FIG. 23. FIG. 23 illustrates an example of a planar layout of the semiconductor memory device 1. In the example of FIG. 23, the blocking portion PW1, the contact plug CS1, the dummy gates DGC1a and DGC1b, and the alignment mark AM are omitted for simplification of description.

As shown in FIG. 23, in this embodiment, the dummy gates DGC2a and DGC2b are eliminated from FIG. 19 of the second example of the third embodiment. Other configurations are the same as those in FIG. 19.

4.2 Effects of Present Embodiment

With the configuration according to the present embodiment, the same effects as the second example and the third example of the third embodiment can be obtained.

In the third example of the third embodiment, the dummy gates DGC2a and DGC2b may be omitted.

5. Modifications, etc.

The semiconductor memory device according to the above embodiment includes a substrate (100) including a first region (MR) including a memory cell array (10), a second region (PR) including a circuit (13) for controlling the memory cell array, a third region (BR) separating a first region and a second region, and a fourth region (ER) surrounding the third region, a first transistor (TR) provided in the second region, a second transistor (DT1a) provided in the third region between the first region and the first transistor and having a gate in an electrically unconnected state, a third transistor (DT1b) provided in third region between the first transistor and the second transistor and having a gate in an electrically unconnected state, and a first insulating layer (55) including a first portion provided above the first to third transistors, and a second portion (PW1) in contact with the substrate between the second transistor and the third transistor.

By applying the above at least one embodiment, it is possible to provide a semiconductor memory device capable of improving yield.

The embodiments are not limited to the above-described embodiment and various modifications may be made.

For example, the case where the transistor TR and the dummy transistor DT are provided on the p-type well regions 50 and 20, respectively, is illustrated, but the present disclosure is not limited thereto. For example, each of the transistor TR and the dummy transistor DT may be provided on the n-type well region. In this case, a p+ diffusion layer region is provided instead of the $n^+$ type diffusion layer region, and a p-channel MOS transistor is provided as the transistor TR.

For example, the above embodiments may be combined as much as possible.

Further, the "connection" in the above embodiments also includes a state in which the connection is made indirectly with something else such as a transistor or a resistor interposed therebetween.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
a substrate including a first region, a second region, a third region, and a fourth region, the first region including a memory cell array, the second region including a circuit for controlling the memory cell array, the third region separating the first region and the second region, and the fourth region surrounding the third region;
a first transistor disposed in the second region;
a second transistor disposed in the third region between the first region and the first transistor, the second transistor having a gate in an electrically unconnected state;
a third transistor provided in the third region between the first transistor and the second transistor, the third transistor having a gate in an electrically unconnected state;
a first insulating layer including (i) a first portion provided above the first to third transistors, and (ii) a second portion in contact with the substrate between the second transistor and the third transistor;
a fourth transistor disposed in the third region between the second region and the fourth region, the fourth transistor having a gate in an electrically unconnected state;
a fifth transistor disposed in the third region between the fourth transistor and the fourth region, the fifth transistor having a gate in an electrically unconnected state;
a plurality of first contact plugs disposed in the third region between the first region and the second transistor;
a second contact plug disposed in the third region between the second region and the fourth transistor; and
a third contact plug disposed in the third region between the fifth transistor and the fourth region, wherein
the first insulating layer further includes a third portion in contact with the substrate between the fourth transistor and the fifth transistor.

2. The semiconductor memory device according to claim 1, wherein
the second transistor includes an annular-shaped gate surrounding the first region,
the second portion surrounds the second transistor, and
the third transistor includes an annular-shaped gate surrounding the second portion.

3. The semiconductor memory device according to claim 2, wherein the annular shaped gate of the second transistor and the annular shaped gate of the third transistor are square shaped.

4. The semiconductor memory device according to claim 2, wherein the gate of the second transistor includes a first protrusion portion, the first protrusion portion arranged between the plurality of first contact plugs on a second surface facing a first surface facing the second portion, and extending toward the first region.

5. The semiconductor memory device according to claim 4, wherein the plurality of first contact plugs include a bent portion, the protrusion portion extending into the bent portion.

6. The semiconductor memory device according to claim 5, wherein the bent portion includes a plurality of straight line portions extending in perpendicular directions.

7. The semiconductor memory device according to claim 6, wherein the straight line portions are not continuous with each other.

8. The semiconductor memory device according to claim 5, wherein the bent portion is bent in a rectangular or arc shape.

9. The semiconductor memory device according to claim 1, wherein
the gate of the fourth transistor has an annular shape surrounding the first and second regions,
the third portion surrounds the fourth transistor, and
the gate of the fifth transistor has an annular shape surrounding the third portion.

10. The semiconductor memory device according to claim 9, wherein
the gate of the fourth transistor includes a second protruding portion, the second protruding portion extending in a direction away from the third portion on a fourth surface facing a third surface facing the third portion, and
the gate of the fifth transistor includes a third protruding portion, the third protruding portion extending in a direction away from the third portion on a sixth surface facing a fifth surface facing the third portion.

11. The semiconductor memory device according to claim 10, wherein
the second contact plug has an annular structure surrounding the first and second regions, and includes:
a fourth portion adjacent to the fourth surface and extending in the first direction;
a fifth portion having one end connected to the first portion, being adjacent to the second protruding portion, and extending in a second direction away from the fourth surface;
a sixth portion having one end connected to the other end of the fifth portion, being adjacent to the second protruding portion, and extending in the first direction;
a seventh portion having one end connected to the other end of the sixth portion, being adjacent to the second protruding portion, and extending in the second direction; and
an eighth portion having one end connected to the other end of the seventh portion, being adjacent to the fourth surface, and extending in the first direction.

12. The semiconductor memory device according to claim 10, wherein
the second contact plug includes:
an eighth portion and a ninth portion adjacent to the fourth surface, being respectively arranged apart from each other in a third direction, and extending in the third direction, and
a tenth portion arranged apart from the eighth and ninth portions in a fourth direction away from the fourth surface, being adjacent to the second protruding portion, and extending in the third direction, and
the length of the tenth portion in the third direction is longer than the distance at which the eighth portion and the ninth portion are separated from each other.

13. The semiconductor memory device according to claim 12, wherein
the tenth portion includes a plurality of eleventh portions being separated in the third direction.

14. A semiconductor memory device comprising:
a substrate including a first region, a second region, a third region, and a fourth region, the first region including a memory cell array, the second region including a circuit for controlling the memory cell array, the third region separating the first region and the second region, and the fourth region surrounding the third region and including a chip outer periphery;
a first insulating layer including, in the third region, a first portion disposed above the substrate, and a second portion in contact with the substrate and having an annular shape surrounding the first and second regions;

a first contact plug disposed in the third region between the first and second regions and the second portion; and a second contact plug disposed between the second portion and the fourth region in the third region, wherein the first contact plug includes:
- a third portion and a fourth portion which are adjacent to the second portion, are respectively arranged apart from each other in a first direction, and extend in the first direction, and
- a fifth portion which is arranged apart from the third and fourth portions in a second direction away from the second portion, and extends in the first direction, and a length of the fifth portion in the first direction is longer than a distance at which the third portion and the fourth portion are separated from each other.

* * * * *